United States Patent
Choi et al.

(10) Patent No.: US 11,463,567 B2
(45) Date of Patent: Oct. 4, 2022

(54) ELECTRONIC DEVICE INCLUDING CAMERA MODULE

(71) Applicant: Samsung Electronics Co., Ltd., Gyeonggi-do (KR)

(72) Inventors: Jongchul Choi, Gyeonggi-do (KR); Minwoo Yoo, Gyeonggi-do (KR); Doohee Hong, Gyeonggi-do (KR); Byounguk Yoon, Gyeonggi-do (KR); Changryong Heo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 155 days.

(21) Appl. No.: 16/923,179

(22) Filed: Jul. 8, 2020

(65) Prior Publication Data

US 2021/0014346 A1 Jan. 14, 2021

(30) Foreign Application Priority Data

Jul. 8, 2019 (KR) .......................... 10-2019-0082322

(51) Int. Cl.
*H05K 1/18* (2006.01)
*H04M 1/02* (2006.01)

(52) U.S. Cl.
CPC ....... *H04M 1/0264* (2013.01); *H04M 1/0266* (2013.01); *H04M 1/0277* (2013.01); *H05K 1/189* (2013.01)

(58) Field of Classification Search
CPC ............. H04M 1/0264; H04M 1/0266; H04M 1/0277; H05K 1/189

(Continued)

(56) References Cited

U.S. PATENT DOCUMENTS 7,623,782 B2 11/2009 Yu
7,729,720 B2 6/2010 Suh et al.
(Continued)

FOREIGN PATENT DOCUMENTS

CN 207039674 U 2/2018
CN 207625662 U 7/2018
(Continued)

OTHER PUBLICATIONS

International Search Report dated Oct. 30, 2020.

*Primary Examiner* — Binh B Tran
(74) *Attorney, Agent, or Firm* — Cha & Reiter, LLC

(57) ABSTRACT

According to certain aspects of the disclosure, an electronic device comprises a housing including a first plate facing a first direction, a second plate facing a second direction opposite to the first direction, and a side member configured to surround a space between the first plate and the second plate; a camera module, at least part of which is disposed in the space; a printed circuit board disposed in the space; and a flexible printed circuit board connecting the camera module and the printed circuit board, wherein between a first position in which the at least part of the camera module is located in the space and a second position in which the at least part of the camera module is located outside the housing in a third direction substantially orthogonal to the first direction and the second direction, the camera module moves in the third direction and rotates to face the first direction or the second direction, wherein the camera module includes a flexible printed circuit board frame configured to receive or shield at least part of the flexible printed circuit board, wherein the flexible printed circuit board includes: a rollable portion including a first distal end of the flexible printed circuit board and a rollable area, wherein the first distal end is connected to one area of the camera module, and at least part of the rollable area is wrapped or unwrapped in the same direction as the rotation of the camera module; a movable portion including a curved area and a second distal end of the flexible printed circuit board, wherein the second distal end extends from the curved area and is connected to the printed circuit board, and a position of the curved area is changed to correspond to the motion of the camera module in the third direction; and a connecting portion configured to connect the rollable portion and the movable portion, and wherein the flexible printed circuit board frame includes: a cylindrical area configured to (Continued)

receive or shield at least part of the rollable portion; and a planar area configured to receive or shield at least part of the movable portion and at least part of the connecting portion, wherein the at least part of the connecting portion is fixed to the planar area.

18 Claims, 27 Drawing Sheets

(58) Field of Classification Search
USPC .......................................... 361/679.01, 749
See application file for complete search history.

(56) References Cited

U.S. PATENT DOCUMENTS

| | | |
|---|---|---|
| 10,021,296 B2 | 7/2018 | Fan et al. |
| 10,425,515 B2* | 9/2019 | Fan ................. G06F 1/1686 |
| 10,637,974 B2* | 4/2020 | Zeng ................ H04M 1/0266 |
| 2005/0024500 A1* | 2/2005 | Katayama ............ H04N 5/2253 |
| | | 348/207.99 |
| 2006/0033832 A1* | 2/2006 | Shin .................. H04N 5/2252 |
| | | 348/E5.026 |
| 2006/0044442 A1 | 3/2006 | Suh et al. |
| 2007/0014569 A1 | 1/2007 | Yu |
| 2015/0189175 A1 | 7/2015 | Fan et al. |

FOREIGN PATENT DOCUMENTS

| | | |
|---|---|---|
| CN | 109068039 A | 12/2018 |
| CN | 109681733 A | 4/2019 |
| KR | 10-2006-0016595 A | 2/2006 |

* cited by examiner

ELECTRONIC DEVICE INCLUDING CAMERA MODULE

CROSS-REFERENCE TO RELATED APPLICATION(S)

This application is based on and claims priority under 35 U.S.C. § 119 to Korean Patent Application No. 10-2019-0082322, filed on Jul. 8, 2019, in the Korean Intellectual Property Office, the disclosure of which is incorporated by reference herein its entirety.

BACKGROUND

1. Field

The disclosure relates to an electronic device including a camera module.

2. Description of Related Art

An electronic device supports various types of interfaces for interactions with a user. Among the interfaces, a display is recognized as a core interface that explicitly provides input and output of information resources involved in various types of functions or services. Accordingly, displays are advancing as a result of improvements in hardware or software. One example of an advanced screen is a full screen display that provides a larger screen area.

The above information is presented as background information only to assist with an understanding of the disclosure. No determination has been made, and no assertion is made, as to whether any of the above might be applicable as prior art with regard to the disclosure.

SUMMARY

In accordance with one aspect of the disclosure, an electronic device comprises: a housing including a first plate facing a first direction, a second plate facing a second direction opposite to the first direction, and a side member surrounding a space between the first plate and the second plate; a camera module having a lens structure comprising one or more lenses, configured to move from a first position to a second position and vice versa, wherein in the first position, the lens structure faces the second direction and is disposed inside the space, wherein in the second position, the lens structure protrudes from the side member and faces the first direction; a printed circuit board disposed in the space; and a flexible printed circuit board connecting the camera module and the printed circuit board.

According to certain aspects of the disclosure, an electronic device comprises a housing including a first plate facing a first direction, a second plate facing a second direction opposite to the first direction, and a side member configured to surround a space between the first plate and the second plate; a camera module, at least part of which is disposed in the space; a printed circuit board disposed in the space; and a flexible printed circuit board connecting the camera module and the printed circuit board, wherein between a first position in which the at least part of the camera module is located in the space and a second position in which the at least part of the camera module is located outside the housing in a third direction substantially orthogonal to the first direction and the second direction, the camera module moves in the third direction and rotates to face the first direction or the second direction, wherein the camera module includes a flexible printed circuit board frame configured to receive or shield at least part of the flexible printed circuit board, wherein the flexible printed circuit board includes: a rollable portion including a first distal end of the flexible printed circuit board and a rollable area, wherein the first distal end is connected to one area of the camera module, and at least part of the rollable area is wrapped or unwrapped in the same direction as the rotation of the camera module; a movable portion including a curved area and a second distal end of the flexible printed circuit board, wherein the second distal end extends from the curved area and is connected to the printed circuit board, and a position of the curved area is changed to correspond to the motion of the camera module in the third direction; and a connecting portion configured to connect the rollable portion and the movable portion, and wherein the flexible printed circuit board frame includes: a cylindrical area configured to receive or shield at least part of the rollable portion; and a planar area configured to receive or shield at least part of the movable portion and at least part of the connecting portion, wherein the at least part of the connecting portion is fixed to the planar area.

Other aspects, advantages, and salient features of the disclosure will become apparent to those skilled in the art from the following detailed description, which, taken in conjunction with the annexed drawings, discloses certain embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

With regard to the description of the drawings, identical or similar reference numerals may be used to refer to identical or similar components.

DETAILED DESCRIPTION

In an implementation of a full screen display, there may be a structure of a camera that is not exposed through a front surface of an electronic device. For example, the lens structure may support taking images of subjects in front of and behind the electronic device without exposure through the full screen display.

Aspects of the disclosure are to address at least the above-mentioned problems and/or disadvantages and to provide at least the advantages described below. Accordingly, an aspect of the disclosure is to provide a camera module and an electronic device including the same, in which the camera module supports taking images of subjects in front of and behind the electronic device without exposure through a front surface of the electronic device.

Hereinafter, certain embodiments of the disclosure may be described with reference to accompanying drawings. Accordingly, those of ordinary skill in the art will recognize that modification, equivalent, and/or alternative on the certain embodiments described herein can be variously made without departing from the scope and spirit of the disclosure.

Figure 1:
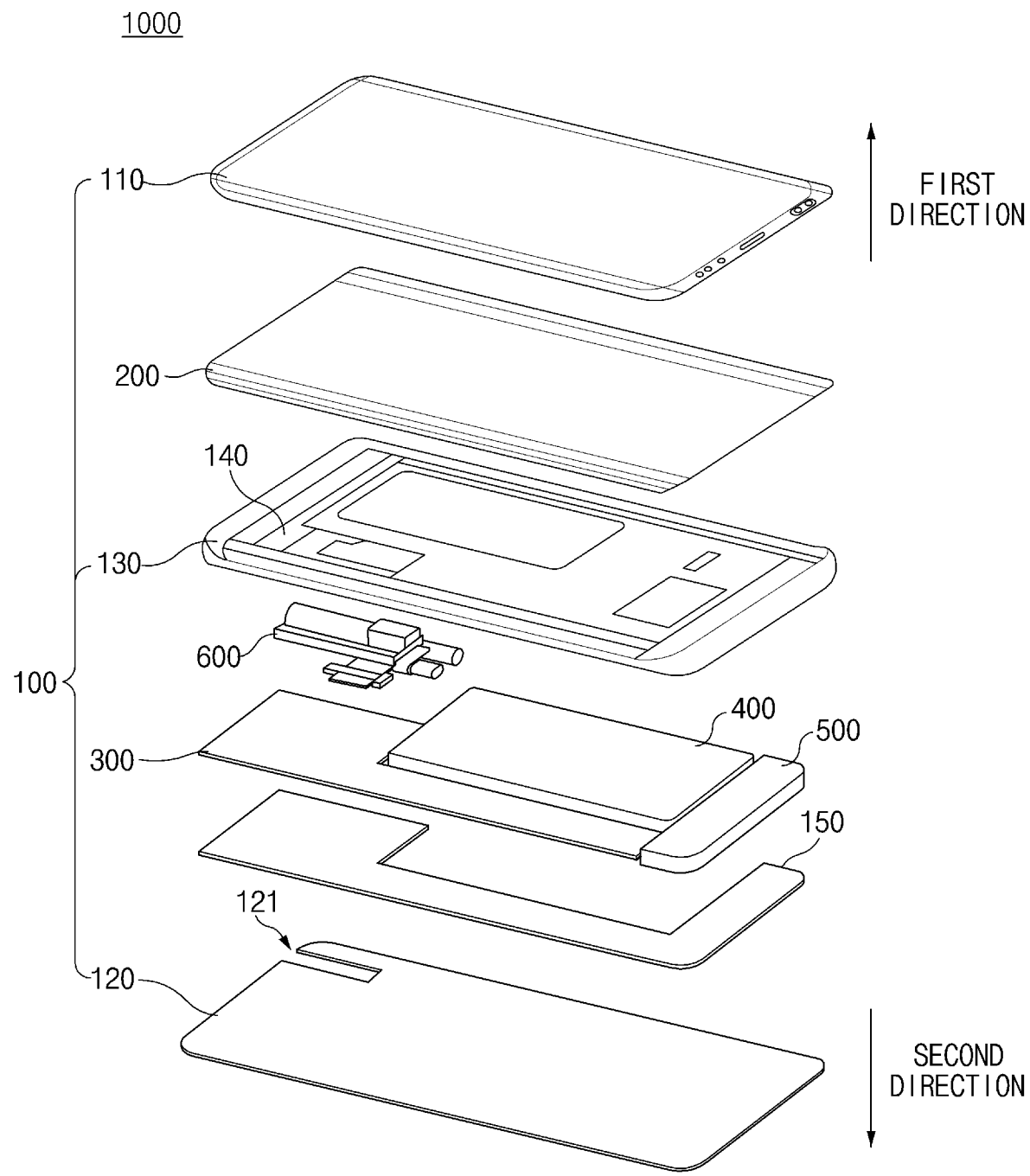
FIG. 1 is an exploded perspective view of an electronic device according to an embodiment.
Figure 2:
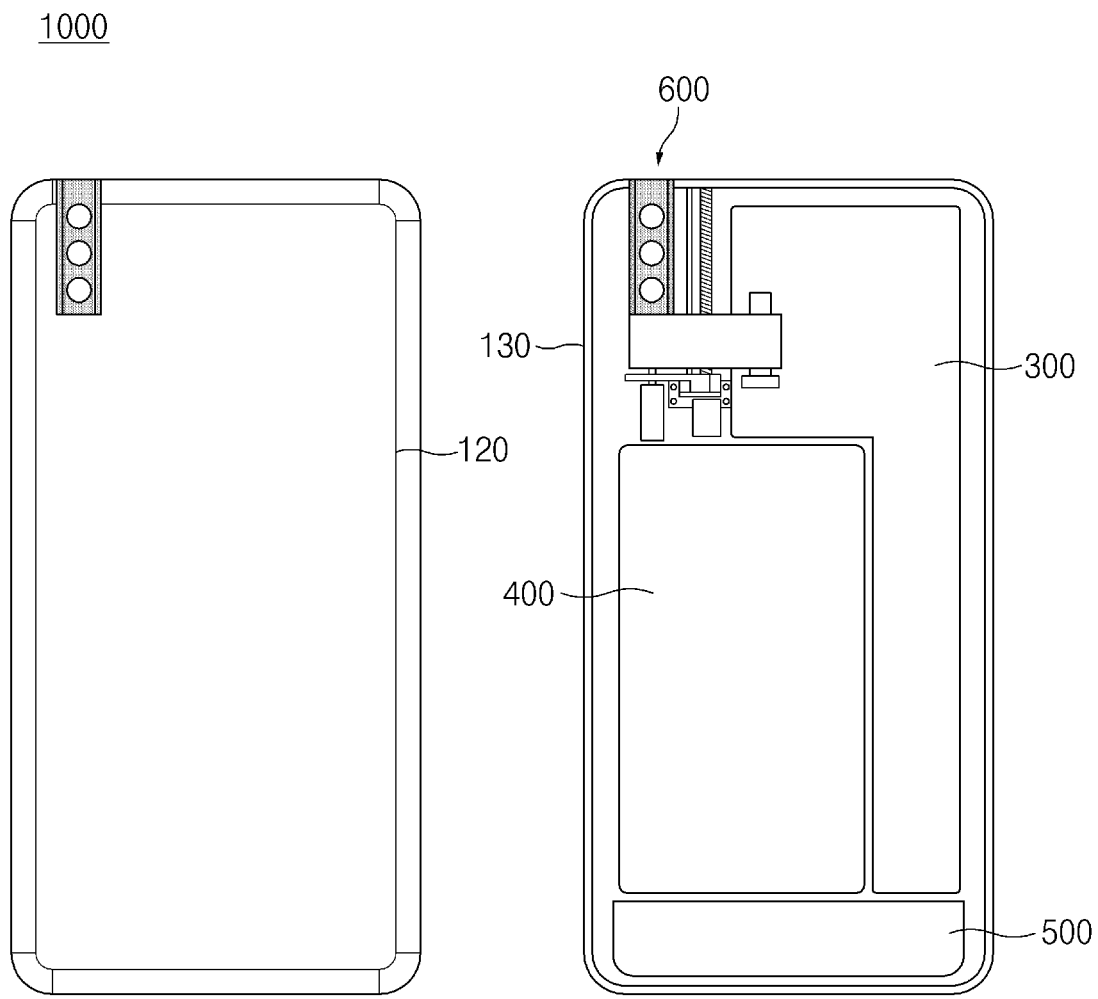
FIG. 2 is a view illustrating a form in which a camera module according to an embodiment is disposed.

FIG. 1 is an exploded perspective view of an electronic device according to an embodiment, and FIG. 2 is a view illustrating a form in which a camera module according to an embodiment is disposed.

According to certain embodiments, an electronic device 1000 can planar. The electronic device 1000 includes a housing that can have a front surface and rear surface, with relatively thin side surfaces. A display 200 can be disposed on the front surface and can generally consume the entirety of the front surface. A printed circuit board 400, battery 500, and camera module 600 are disposed between the front surface and rear surface.

Referring to FIG. 1, the electronic device 1000 according to the embodiment may include a housing 100, a display 200, a printed circuit board 300, a battery 400, a speaker module 500, and a camera module 600. In certain embodiments, the electronic device 1000 may not include at least one of the aforementioned components, or may further include other component(s). For example, the electronic device 1000 may further include at least some of components of an electronic device 2001 that will be described below with reference to FIG. 27.

The housing 100 may form at least part of the external appearance of the electronic device 1000. In this regard, the housing 100 may be formed by mutually combining or attaching a first plate 110 facing a first direction (such as a front direction), a second plate 120 facing a second direction opposite to the first direction (such as a rear direction), and a side member 130 surrounding a space between the first plate 110 and the second plate 120. According to an embodiment, the space formed by combining or attaching the first plate 110, the second plate 120, and the side member 130 may be understood as an interior space of the housing 100.

In certain embodiments, the housing 100 may further include a first support member 140 and a second support member 150. The first support member 140 may be connected (or, coupled) with the side member 130, or may be integrally formed with the side member 130. In an embodiment, the display 200 may be disposed on (or, coupled to) one surface of the first support member 140 that faces the first direction, and the printed circuit board 300 may be disposed on (or, coupled to) an opposite surface of the first support member 140 that faces the second direction. The second support member 150 may be disposed on the bottom of the printed circuit board 300 and may support at least part of the printed circuit board 300.

In an embodiment, the second plate 120 may include an opening 121 for exposing, to the outside, at least part of the camera module 600 received in the interior space of the housing 100. For example, the opening 121 having an area, a length, or a width by which exposure of at least one lens included in the camera module 600 is able to be covered may be formed in one area of the second plate 120 that faces the received camera module 600.

In certain embodiments, at least one sensor for sensing various types of information may be disposed in a space formed by coupling the display 200, the one surface of the first support member 140, and the side member 130. According to certain embodiments, the display 200 may be implemented with a touch screen display including a touch panel (or, a touch sensor).

In an embodiment, the printed circuit board 300, the battery 400, the speaker module 500, and the camera module 600 may be received in a space formed by coupling the opposite surface of the first support member 140, the second plate 120, and the side member 130. For example, to avoid or minimize mutual overlap, the printed circuit board 300, the battery 400, the speaker module 500, and the camera module 600 may be associatively disposed to correspond to the shapes of other components.

In this regard, referring to FIG. 2, when the second plate 120 is removed from the electronic device 1000, the speaker module 500 may be disposed on a lower side of the electronic device 1000, and the printed circuit board 300 and the battery 400 may be disposed on an upper side of the speaker module 500. For example, on an upper side of the speaker module 500, the battery 400 may be disposed adjacent to the left side member 130, and on an upper side of the speaker module 500, the printed circuit board 300 may extend beyond the battery 400 from an area adjacent to the right side member 130.

In an embodiment, the camera module 600 may be disposed in a space defined by first plate 110, second plate 120, the printed circuit board 300, the battery 400, and the side member 130. For example, the camera module 600 may be disposed such that the at least one lens included in the camera module 600 faces the second direction (refer to FIG. 1). According to certain embodiments, the camera module 600 may include at least one camera device. For example, the camera module 600 may be formed of one module including one lens structure, or may be formed of one module including a plurality of lens structures. In an embodiment, the battery 400, the speaker module 500, and the camera module 600 may be electrically connected with the printed circuit board 300 through at least one of a conductive line, a flexible PCB, and a connector.

Users generally desire electronic devices 1001 with large display 200 and full range camera 600 functions. However, a problem occurs because in order to provide a front facing camera (a "selfie camera"), the camera has to be exposed in the first direction. This potentially limits the size of the large screen. That is, if the display 200 consumes the entire front plate 110, there may be no place on the front plate 110 to dispose the camera module 600.

According to one embodiment of the present disclosure, the camera module 600 is disposed between the front plate 110 and the second plate 120. The camera 600 can operate in two states. During a first state (see FIG. 3), the camera module 600 is within a space define by the front plate 110 the second plate 120 and the side member 130. During a second state (see FIG. 4), the camera module 600 protrudes from the side member 130.

Figure 3:
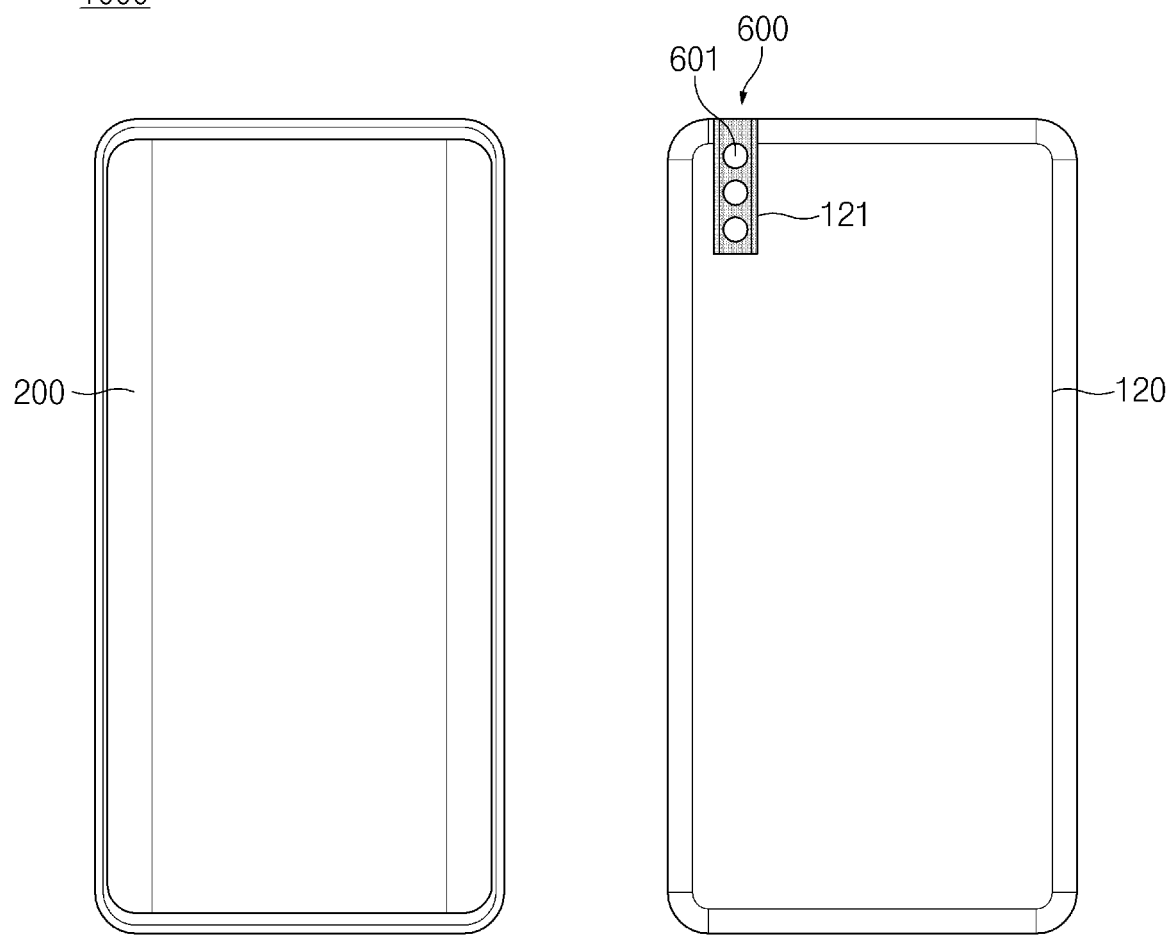
FIG. 3 is a view illustrating a first state of the camera module in the electronic device according to the embodiment.
Figure 4:
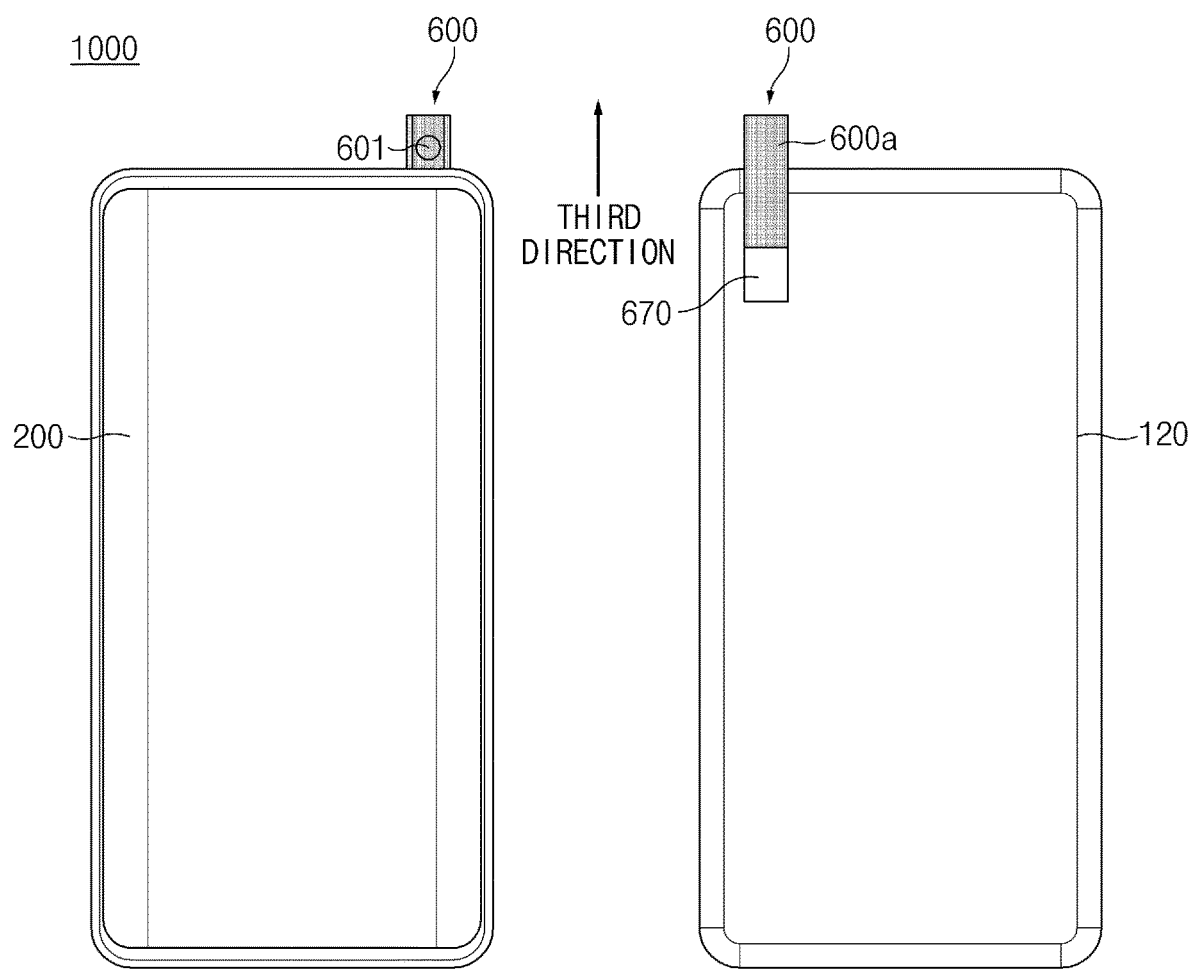
FIG. 4 is a view illustrating a second state of the camera module in the electronic device according to the embodiment.

FIG. 3 is a view illustrating a first state of the camera module in the electronic device according to the embodiment, and FIG. 4 is a view illustrating a second state of the camera module in the electronic device according to the embodiment.

Referring to FIG. 3, the camera module 600 may be operated in the first state on the electronic device 1000. According to an embodiment, the first state may be a state in which the camera module 600 does not protrude outside the electronic device 1000. For example, the first state may be a state in which the camera module 600 exists in a first position inside the housing 100 (refer to FIG. 1) and does not protrude outside the electronic device 1000 (or, outside the housing 100). In an embodiment, when the camera module 600 is in the first state, at least part of the camera module 600 may be exposed to the outside through the opening 121 (refer to FIG. 1) that is formed in the second plate 120. For example, at least one lens 601 included in the camera module 600 may be exposed to the outside through the opening 121, facing the second direction (refer to FIG. 1) (or, the back of the electronic device 1000). Furthermore, in the case where the camera module 600 is in the first state, the portion of the camera module 600 that faces the first direction may not be visible.

Referring to FIG. 4, the camera module 600 may be operated in the second state on the electronic device 1000. The second state may be a state that is changed from the first state by motion of the camera module 600. For example, the second state may result from the camera module 600 in the first state moving linearly in a third direction perpendicular/orthogonal (or substantially perpendicular/orthogonal, or within 3 degrees of perpendicular/orthogonal, now collectively referred to as "perpendicular") to the first direction (refer to FIG. 1) and the second direction and at least part of the camera module 600 protrudes to a second position outside the electronic device 1000 (or, outside the housing 100).

Furthermore, the second state may be a state in which the camera module 600 rotates while moving in the third direction (or, rotates after moving in the third direction) and the at least one lens 601 included in the camera module 600 faces the first direction (or, the front of the electronic device 1000) in the second position. In this regard, an opening (not illustrated) through which the camera module 600 protrudes may be formed in one area of the side member 130 (refer to FIG. 1) that corresponds to the position of the camera module 600 in the third direction. In certain embodiments, at least one of linear momentum and angular momentum of the camera module 600 may be designed depending on the number of lenses 601 that are to face the first direction. In an embodiment, in a case where the camera module 600 is in the second state, the display 200 and at least part (e.g., the at least one lens 601) of the camera module 600 in the second state may be visible when the electronic device 1000 is viewed in the second direction.

Furthermore, in the case where the camera module 600 is in the second state, when the electronic device 1000 is viewed in the first direction, at least part of a rear surface 600a of the camera module 600 in the second state and at least part of a flexible printed circuit board frame 670 (that will be described below with reference to FIG. 5) may be visible through the opening 121 formed in the second plate 120.

According to certain embodiments, depending on linear momentum of the camera module 600 or set structure design of the electronic device 1000, components may not be visible through the opening 121, or only at least part of the rear surface 600a of the camera module 600 may be visible through the opening 121.

According to an embodiment, the camera module 600 may be changed from the first state to the second state, or vice versa. For example, the camera module 600 in the second state may be changed to the first state by moving in the opposite direction to the third direction while rotating such that the at least one lens 601 facing the first direction faces the second direction (or, by performing moving in the opposite direction to the third direction after performing rotary motion such that the at least one lens 601 facing the first direction faces the second direction).

According to an embodiment, in the first position, the lens structure 680 (refer to FIG. 5 or 6) is arranged such that the optical axis of lens 601 is substantially parallel to the second direction (refer to FIG. 1). In the first position, the lens structure 680 (refer to FIG. 1) is disposed inside the housing 100 (refer to FIG. 1).

According to an embodiment, in the second position, the lens structure 680 (refer to FIG. 5 or 6) is arranged such that the optical axis of lens 601 is substantially parallel to the first direction (refer to FIG. 1). In the second position, the lens structure 680 protrudes from the side member 130 (refer to FIG. 1 or 2).

Figure 5:
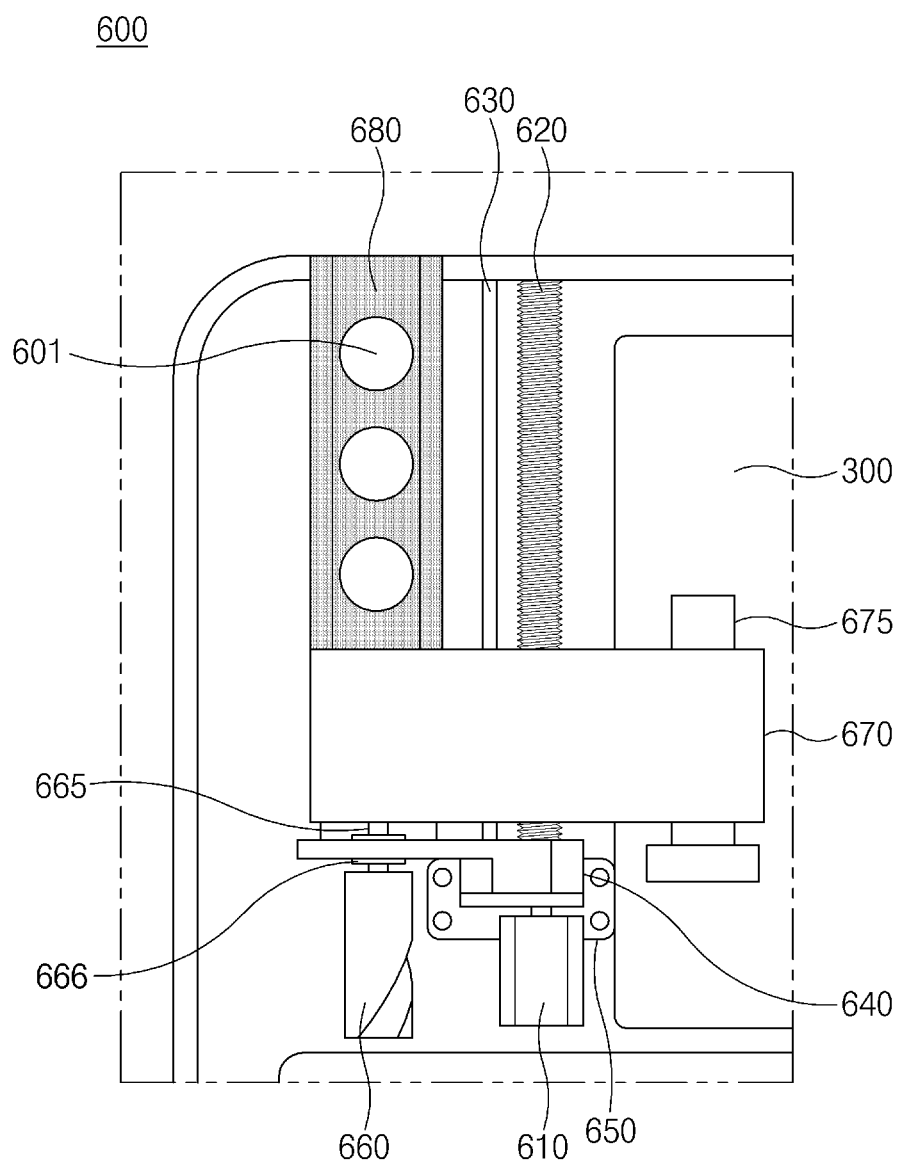
FIG. 5 is a view illustrating the camera module in the first state according to an embodiment.
Figure 6:
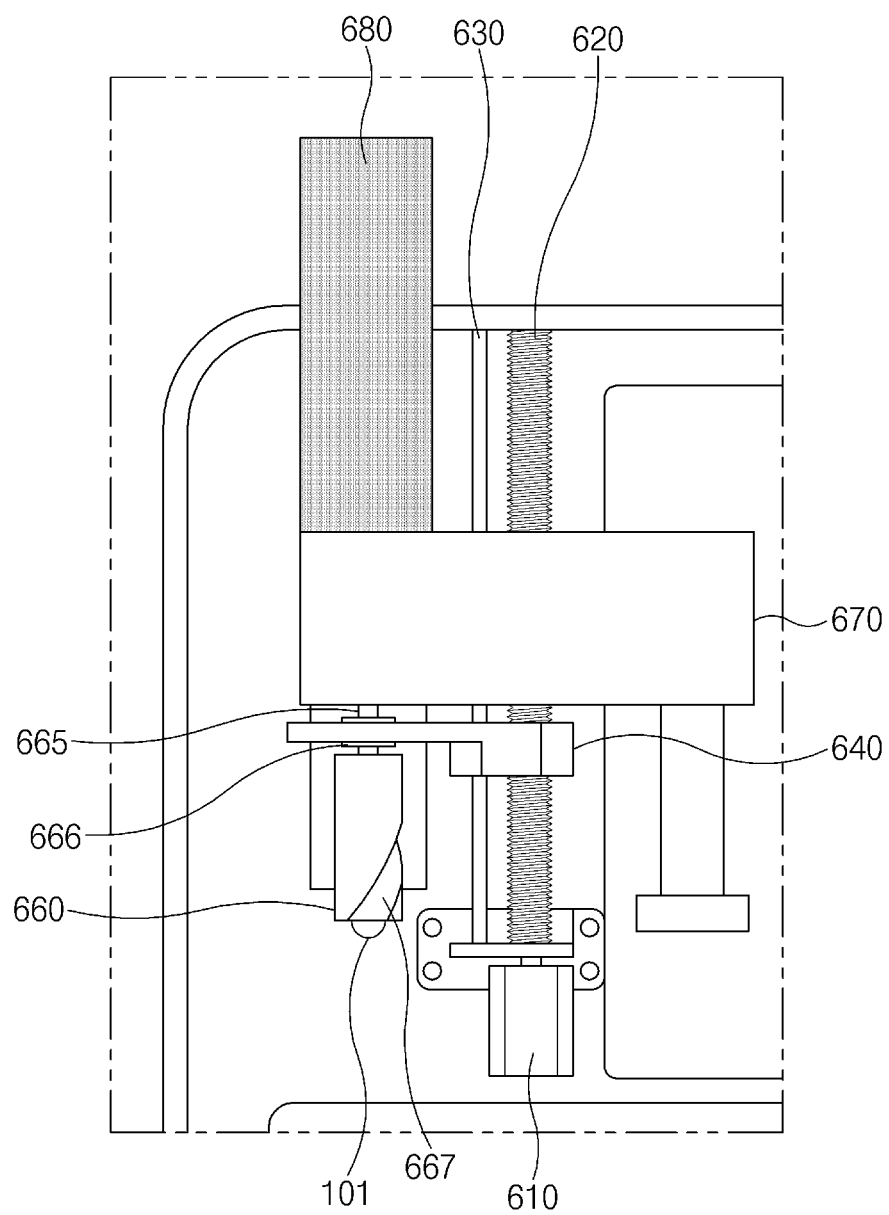
FIG. 6 is a view illustrating the camera module in the second state according to an embodiment.

FIG. 5 is a view illustrating the camera module in the first state according to an embodiment, and FIG. 6 is a view illustrating the camera module in the second state according to an embodiment.

Referring to FIGS. 5 and 6, the camera module 600 according to an embodiment may include a motor 610, a first shaft 620, a second shaft 630, a first bracket 640, a second bracket 650, a cylindrical cam 660, the flexible printed circuit board frame 670, and a lens structure 680.

In certain embodiments, the camera module 600 may not include at least one of the aforementioned components, or may further include other component(s). For example, the camera module 600 may further include the at least one lens 601, a third shaft 665 connecting the cylindrical cam 660 and the lens structure 680, and a flexible printed circuit board 675 electrically connecting the printed circuit board 300 and the lens structure 680.

The motor 610 may provide power for moving the camera module 600. For example, the motor 610 may operate in response to a user input to a virtual object displayed on the display 200 (e.g., a camera application program), or in response to a user input to a hardware button.

The first shaft 620 may be connected, at one end thereof, to a rotary shaft of the motor 610. The first shaft 620 may rotate clockwise or counter-clockwise depending on operation of the motor 610. In an embodiment, the first shaft 620 may include a thread on at least part of the surface thereof.

The second shaft 630 may be spaced apart from the first shaft 620 by a specified distance and may be disposed parallel (substantially parallel or within 3 degrees of parallel, now collectively referred to as "parallel") to the first shaft 620. One end of the second shaft 630 may be fixed to a second bracket 650 secured to the first support member 140 (refer to FIG. 1) of the housing 100 (refer to FIG. 1), and an opposite end of the second shaft 630 may be fixed to the side member 130 (refer to FIG. 1) of the housing 100.

The first bracket 640 may move (e.g., first linear motion) in the third direction (refer to FIG. 4) as a result of rotation of the first shaft 620. In this regard, the first bracket 640 may include a plurality of through-holes. The first shaft 620, the second shaft 630, and the third shaft 665 may pass through the plurality of through-holes of the first bracket 640. In an embodiment, an inner surface of a first through-hole, into which the first shaft 620 is inserted, among the plurality of through-holes may include a thread engaged with the thread included in the first shaft 620. Accordingly, when the motor 610 rotates the first shaft 620, the threads of the shaft 620 drive the first bracket 640 upwards or downwards.

The cylindrical cam 660 may be disposed on a lower side of the first bracket 640 (e.g., in the opposite direction to the third direction) and may be connected with the lens structure 680 through the third shaft 665. For example, the cylindrical cam 660 and the lens structure 680 may be connected with each other by being connected to one end and an opposite end of the third shaft 665 that passes through a through-hole formed in the first bracket 640. According to an embodiment, the third shaft 665 may include a plurality of protruding rings 666 between which the first bracket 640 is located (or, that constrain the first bracket 640 in the third direction and the opposite direction thereto). The cylindrical cam 660 may have grooves that cause the cylindrical cam 660 to rotate when the first bracket 640 moves up or down, thereby causing the at least one lens 601 to rotate.

The flexible printed circuit board frame 670 may be disposed on an upper side of the first bracket 640 (e.g., in the third direction) and on a lower side of the lens structure 680 (e.g., in the opposite direction to the third direction). In an embodiment, the flexible printed circuit board frame 670 may shield or receive at least part of the third shaft 665 connected with the lens structure 680 and at least part of the flexible printed circuit board 675 electrically connecting the lens structure 680 and the printed circuit board 300.

In an embodiment, when the camera module 600 is in the first state (refer to FIG. 5), the camera module 600 may exist in the first position inside the housing 100 and may not protrude outside the electronic device 1000, and the at least one lens 601 may face the second direction (refer to FIG. 1) (or, the back of the electronic device 1000). Alternatively, when the camera module 600 is changed from the first state to the second state (refer to FIG. 6), at least part of the camera module 600 may protrude to the second position outside the housing 100, and the at least one lens 601 may face the first direction (refer to FIG. 1) (or, the front of the electronic device 1000).

An operation of changing the camera module 600 from the first state to the second state will be described. When the first shaft 620 connected with the motor 610 rotates in one direction to correspond to operation of the motor 610, the first bracket 640 may moves straight in the third direction by the engagement of the thread of the first shaft 620 and the thread on the inner surface of the first through-hole included in the first bracket 640. In an embodiment, when the first bracket 640 moves, the second shaft 630 fixed to the second bracket 650 and the side member 130, may suppress pitch or rotation of the first bracket 640.

In an embodiment, as the first bracket 640 moves in the third direction, at least one of the plurality of protruding rings 666 formed on the third shaft 665 may be pressed in the third direction by the first bracket 640 to allow the third shaft 665 to perform move in the third direction (e.g., fourth linear motion) and allow the cylindrical cam 660 connected to the third shaft 665 to move (e.g., second linear motion) in the third direction. Accordingly, the lens structure 680 connected with the third shaft 665 may move in the third direction (e.g., third linear motion) in conjunction with the linear motion of the third shaft 665, and at least part of the lens structure 680 may protrude outside the housing 100. Furthermore, the at least one of the plurality of protruding rings 666 may press the flexible printed circuit board frame 670 disposed on the upper side of the first bracket 640 and may allow the flexible printed circuit board 670 to move in the third direction.

The cylindrical cam 660 may rotate (e.g., first rotary motion) in one direction in the operation in which the third shaft 665, the cylindrical cam 660, and the lens structure 680 move in the third direction. In this regard, the cylindrical cam 660 may include a screw-shaped groove 667 on at least part of an outer surface thereof. For example, at least part of a ball-shaped protrusion 101 fixed to the first support member 140 of the housing 100 may be received in the groove 667, and the cylindrical cam 660 may rotate in the one direction by the protrusion 101 guided along the groove 667 while the first bracket 640, moves in the third direction.

In an embodiment, the rotation of the cylindrical cam 660 may be associated with rotation (e.g., third rotary motion) of the third shaft 665 connected to the cylindrical cam 660, and the lens structure 680 connected to the third shaft 665 may rotate (e.g., second rotary motion) to correspond to the rotation of the third shaft 665 while performing the moving in the third direction (or, after with specified momentum).

When the lens structure 680 rotates, the at least one lens 601 facing the second direction (or, the back of the electronic device 1000) in the first state may turn to face the first direction (or, the front of the electronic device 1000). In an embodiment, when the at least one lens 601 substantially faces the first direction, the operation of changing the state of the camera module 600 may be completed. Alternatively, the state of the camera module 600 may be completely changed at the time when the movement and rotation of the lens structure 680 are completed.

According to certain embodiments, an operation of changing the camera module 600 from the second state to the first state may be implemented by performing the above-described operations of the components of the camera module 600 in the reverse order. For example, when the first shaft 620 rotates in an opposite direction by operation of the motor 610, the first bracket 640 may move (hereinafter, referred to as the fourth direction) that opposite to the third direction. As the first bracket 640 moves in the fourth direction, at least one of the plurality of protruding rings 666 formed on the third shaft 665 may be pressed by the first bracket 640 to allow the third shaft 665 and the cylindrical cam 660 to move in the fourth direction.

In this case, the lens structure 680 connected with the third shaft 665 may move in the fourth direction, and the at least part of the lens structure 680 that protrudes outside the housing 100 may be drawn back into the housing 100. Furthermore, the lens structure 680 may press the flexible printed circuit board frame 670 disposed on the lower side thereof and may allow the flexible printed circuit board frame 670 to move in the fourth direction.

In an embodiment, the cylindrical cam 660 may rotate in an opposite direction by the groove 667 and the protrusion 101 during the operation in which the third shaft 665, the cylindrical cam 660, and the lens structure 680 move in the fourth direction. The rotation of the cylindrical cam 660 may be associated with, for example, rotation of the third shaft 665 connected to the cylindrical cam 660, and to correspond to the rotation of the third shaft 665, the lens structure 680 may perform rotary motion in the opposite direction while performing the linear motion (or, after performing the linear motion with specified momentum). Accordingly, the at least one lens 601 facing the first direction (or, the front of the electronic device 1000) in the second state may gradually face the second direction (or, the back of the electronic device 1000), and when the at least one lens 601 substantially faces the second direction, the state of the camera module 600 may be completely changed.

According to an embodiment, in the first position (e.g., FIG. 5), the lens structure 680 is arranged such that the optical axis of lens 601 is substantially parallel to the second direction (refer to FIG. 1). In the first position, the lens structure 680 is disposed inside the housing 100 (refer to FIG. 1).

According to an embodiment, in the second position (e.g., FIG. 6), the lens structure 680 is arranged such that the optical axis of lens 601 is substantially parallel to the first direction (refer to FIG. 1). In the second position, the lens structure 680 protrudes from the side member 130 (refer to FIG. 1 or 2).

Figure 7:
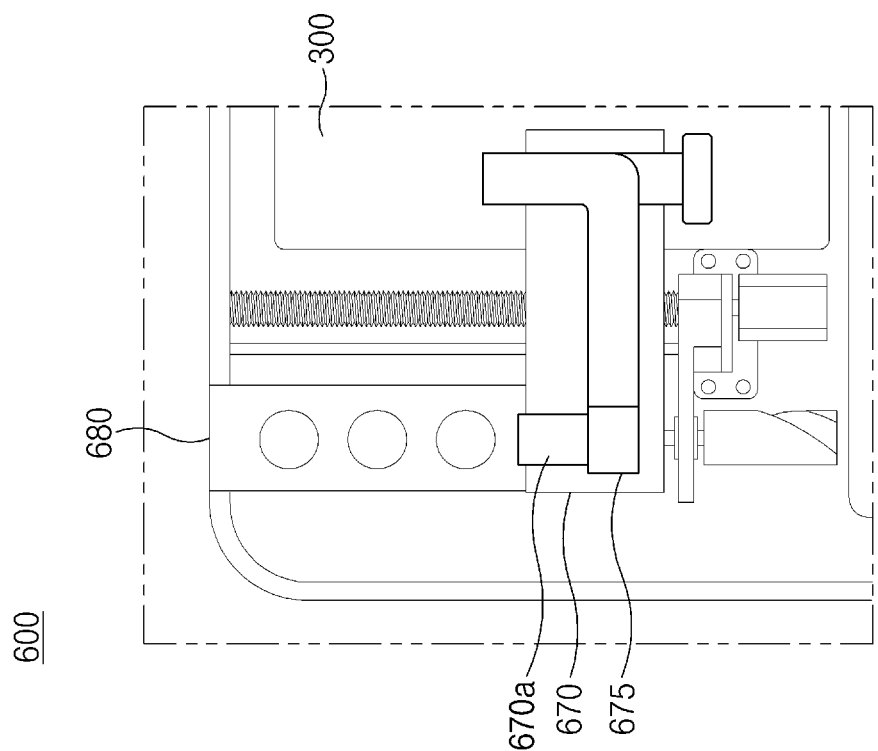
FIG. 7 is a view illustrating the shape of a flexible printed circuit board when the camera module according to the embodiment is in the first state.
Figure 7:
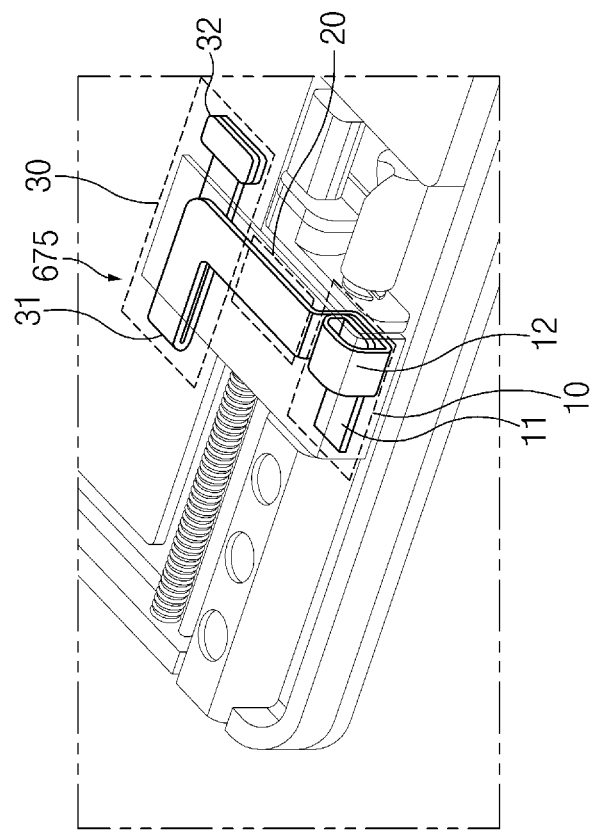
Figure 8:
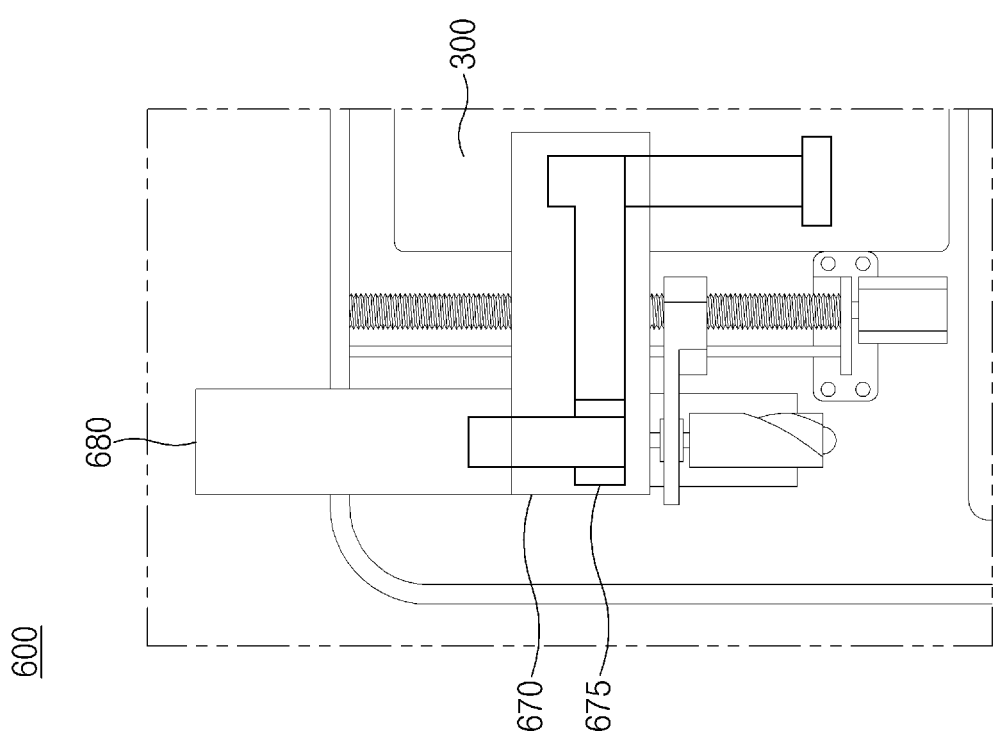
FIG. 8 is a view illustrating the shape of the flexible printed circuit board when the camera module according to the embodiment is in the second state.
Figure 8:
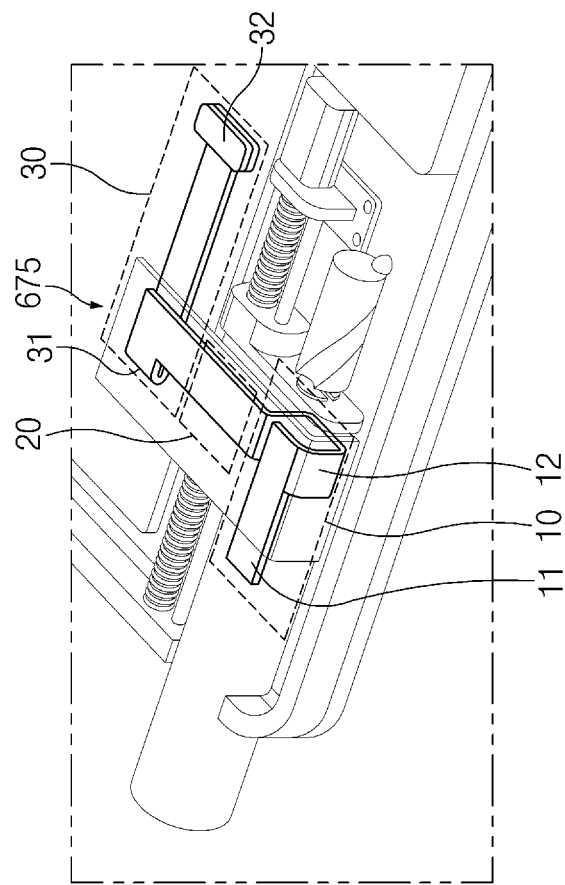
Figure 9:
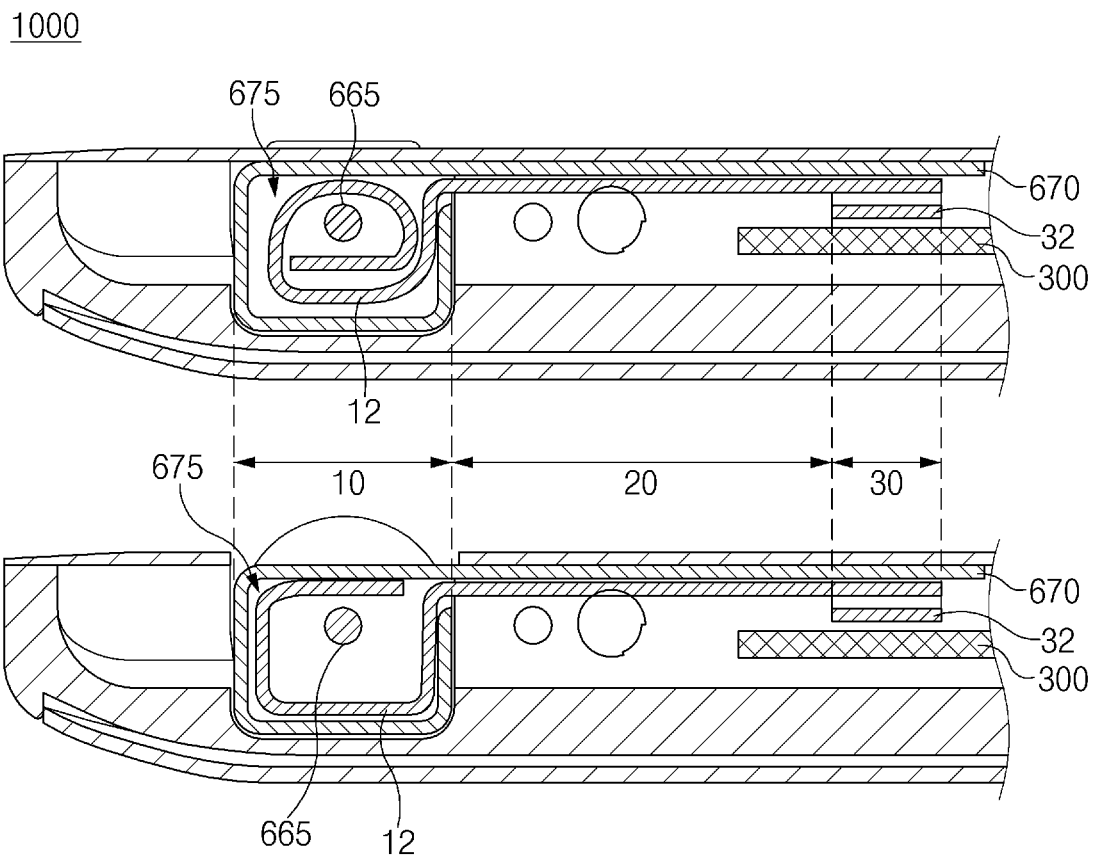
FIG. 9 illustrates sectional views of the electronic device according to the embodiment in one direction.

FIG. 7 is a view illustrating the shape of the flexible printed circuit board when the camera module according to the embodiment is in the first state. FIG. 8 is a view illustrating the shape of the flexible printed circuit board when the camera module according to the embodiment is in second state. FIG. 9 illustrates sectional views of the electronic device according to the embodiment in one direction.

The flexible printed circuit board includes a rollable area 12 that wraps and unwraps around a portion of the camera module 600. When the camera module 600 is a first position, where the camera module 600 is entirely within the housing, the flexible printed circuit is wrapped around the portion camera module. When the camera module moves to the first position to the second position, as the lens structure rotates, the flexible printed circuit unwraps. When the camera module moves from the second position to the first position, the flexible printed circuit wraps around the portion of the camera module.

Referring to FIGS. 7, 8, and 9, the flexible printed circuit board frame 670 may include a cylindrical area 670a corresponding to the position of the lens structure 680 (comprising the one or more lenses) and a planar area extending from the cylindrical area toward the printed circuit board 300. In this regard, at least part of the flexible printed circuit board 675 may be received in the cylindrical area of the flexible printed circuit board frame 670, or may be shielded by the planar area. For example, the flexible printed circuit board 675 may include a rollable portion 10 received in the cylindrical area of the flexible printed circuit board frame 670 and a connecting portion 20 and a movable portion 30 shielded by the planar area of the flexible printed circuit board frame 670.

The rollable portion 10 may include a first distal end 11 on one side of the flexible printed circuit board 675. The first distal end 11 may be electrically connected with one area of the lens structure 680. Furthermore, the rollable portion 10 may include a rollable area 12 continuous with the first distal end 11. In an embodiment, as the camera module 600 performs rotary motion in one direction, the rollable area 12 may be rolled about the third shaft 665, which passes through the cylindrical area of the flexible printed circuit board frame 670, in the same rotational direction, and as the camera module 600 performs rotary motion in an opposite direction, the rollable area 12 may be unrolled about the third shaft 665 in the same rotational direction.

The movable portion 30 may include a second distal end 32 on an opposite side of the flexible printed circuit board 675 and a curved area 31 continuous with the second distal end 32. In an embodiment, the second distal end 32 may be electrically connected with the printed circuit board 300, and the position of the curved area 31 may be changed depending on linear motion of the camera module 600 in the third direction (refer to FIG. 4) or in the opposite direction to the third direction.

The connecting portion 20 may connect the rollable portion 10 and the movable portion 30. For example, the connecting portion 20 may connect a distal end of the rollable portion 10 that is continuous with the rollable area 12 and a distal end of the movable portion 30 that is continuous with the curved area 31. According to an embodiment, at least part of the connecting portion 20 may be fixed to the planar area of the flexible printed circuit board frame 670 so as to suppress pitch or distortion of the flexible printed circuit board 675 due to rolling or unrolling of the rollable area 12 depending on rotary motion of the camera module 600 or a change in the position of the curved area 31 depending on linear motion of the camera module 600.

A change in the shape of the flexible printed circuit board 675 when the camera module 600 is changed from the first state to the second state will be described. When the camera module 600 is in the first state (refer to FIGS. 7 and 9), the rollable area 12 of the rollable portion 10 may remain rolled in the cylindrical area of the flexible printed circuit board frame 670. Furthermore, outside the planar area of the flexible printed circuit board frame 670, the curved area 31 of the movable portion 30 may be maintained in a first position spaced apart from the connecting portion 20 by a specified first distance.

In an embodiment, when the camera module 600 is changed to the second state by linear motion and rotary motion (refer to FIGS. 8 and 9), the lens structure 680 and the flexible printed circuit board frame 670 may perform linear motion in the third direction, and the lens structure 680 may perform rotary motion in one direction while performing the linear motion (or, after performing the linear motion in the third direction). Accordingly, the first distal end 11 of the rollable portion 10 that is connected to the lens structure 680 may rotate in the one direction, and the rollable area 12 of the rollable portion 10 may be unrolled in the cylindrical area of the flexible printed circuit board frame 670 to correspond to the rotation of the first distal end 11. Furthermore, as the connecting portion 20, at least part of which is fixed to the planar area of the flexible printed circuit board frame 670, is pulled in the third direction, the curved area 31 of the movable portion 30 may be changed to a second position spaced apart from the connecting portion 20 by a specified second distance (e.g., a distance shorter than the first distance) under the planar area of the flexible printed circuit board frame 670.

In certain embodiments, when the camera module 600 is changed from the second state to the first state, the above-described change in the shape of the flexible printed circuit board 675 may be performed in the reverse order. For example, when the lens structure 680 and the flexible printed circuit board frame 670 perform linear motion in the opposite direction to the third direction and the lens structure 680 performs rotary motion in an opposite direction while performing the linear motion (or, after performing the linear motion), the first distal end 11 of the rollable portion 10 that is connected to the lens structure 680 may rotate in the opposite direction, and the rollable area 12 of the rollable portion 10 may be rolled in the cylindrical area of the flexible printed circuit board frame 670. Furthermore, as the connecting portion 20, at least part of which is fixed to the planar area of the flexible printed circuit board frame 670, is pulled in the opposite direction to the third direction, the curved area 31 of the movable portion 30 may be changed from the second position to the first position with respect to the connecting portion 20.

Figure 10:
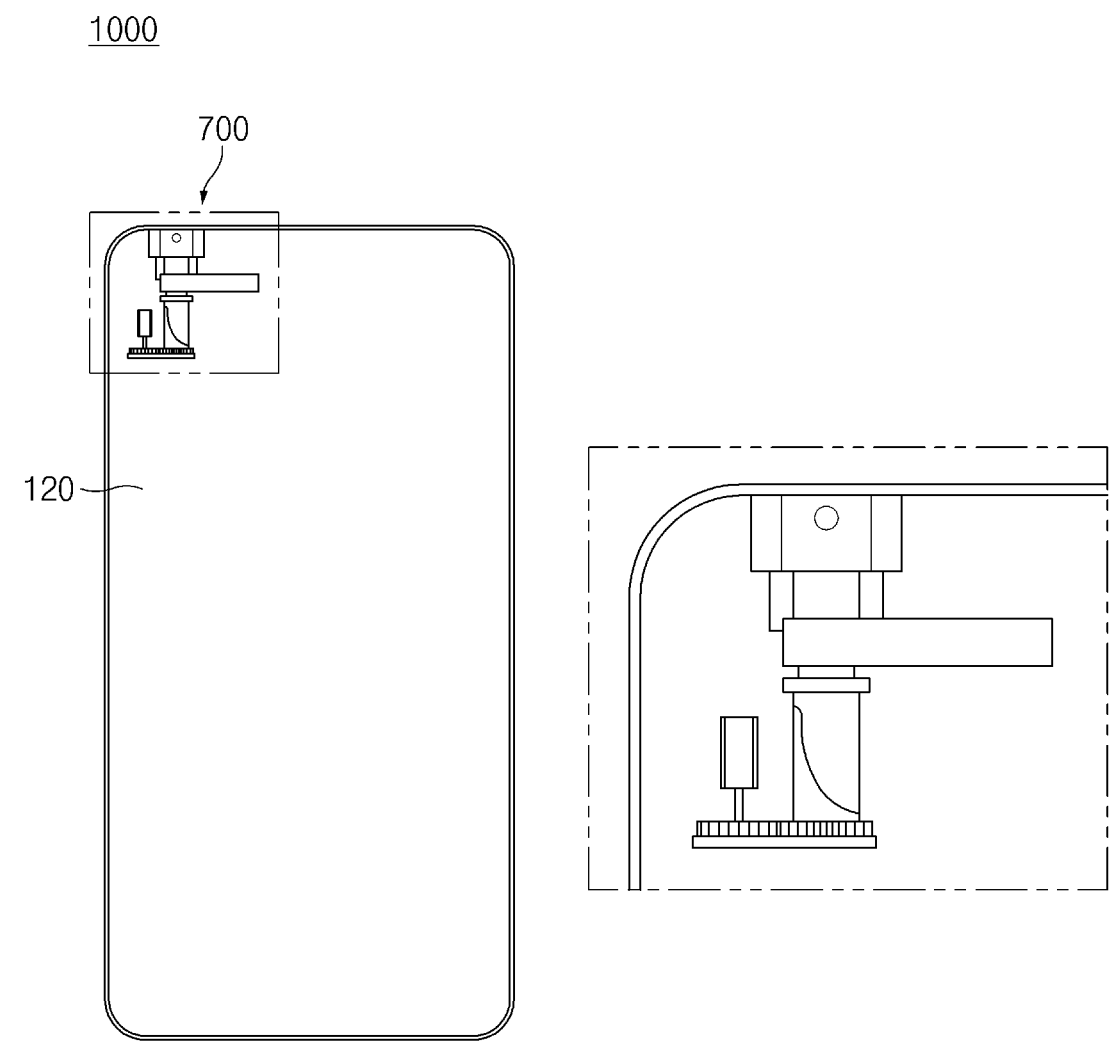
FIG. 10 is a view illustrating a form in which a camera module according to another embodiment is disposed.
Figure 11:
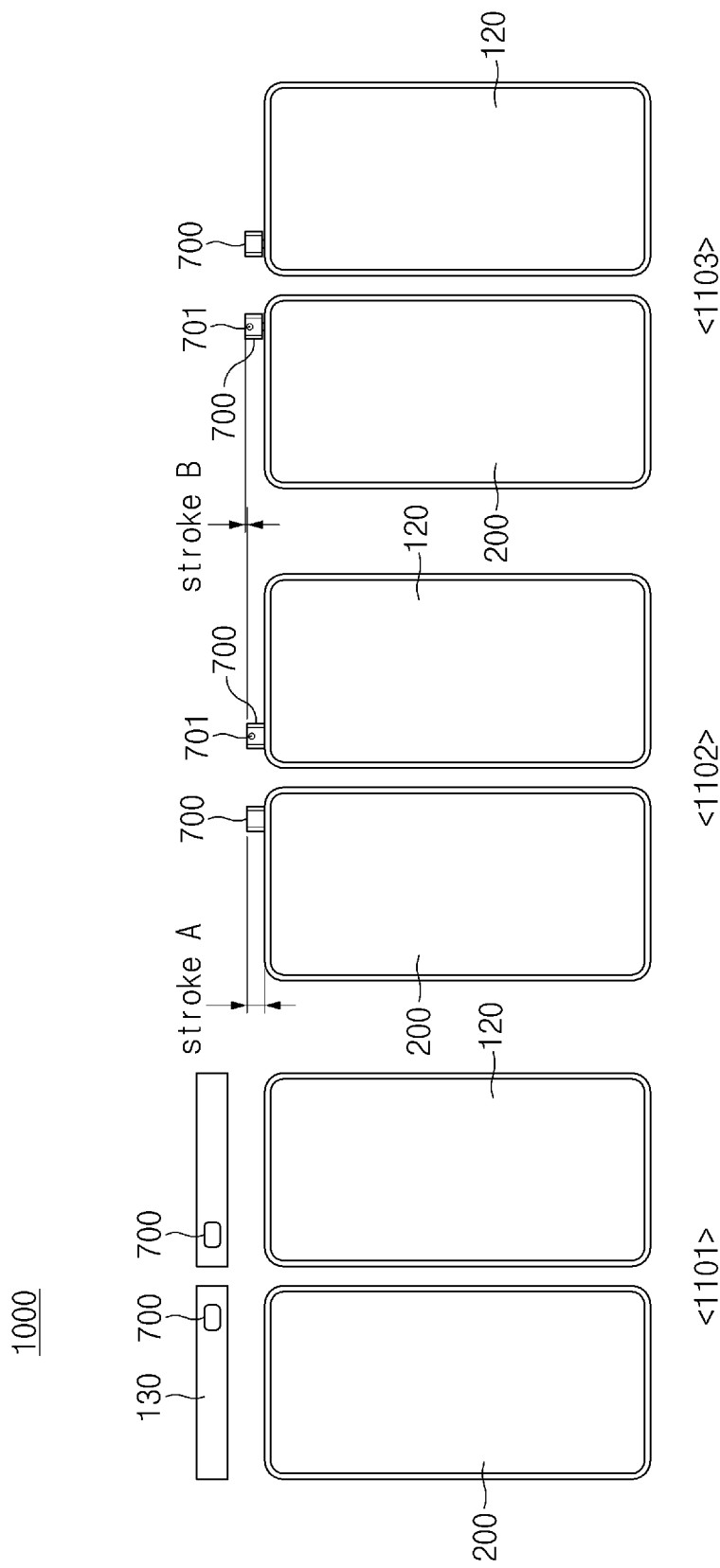
FIG. 11 is a view illustrating various states of the camera module in the electronic device according to the embodiment.

FIG. 10 is a view illustrating a form in which a camera module according to another embodiment is disposed, and FIG. 11 is a view illustrating various states of the camera module in the electronic device according to the embodiment.

Referring to FIGS. 10 and 11, the electronic device 1000 may include the camera module 700 according to the other embodiment. For example, similarly to the camera module 600 (refer to FIG. 2) described above with reference to FIG. 2, the camera module 700 according to the other embodiment may be disposed in the space defined by the printed circuit board 300 (refer to FIG. 2), the battery 400 (refer to FIG. 2), and the side member 130 (refer to FIG. 2). The opening 121 (refer to FIG. 1) in the second plate 120 may be excluded, and the camera module 700 may be operated in a first state 1101 of being shielded by the housing 100 in a first position inside the housing 100 (refer to FIG. 1). According to certain embodiments, the first state 1101 may be a state in which the camera module 700 is not separately operated on the electronic device 1000. In an embodiment, at least one lens included in the camera module 700 in the first state 1101 may face the second direction (refer to FIG. 1) (or, the back of the electronic device 1000) in the first position inside the housing 100.

According to an embodiment, the camera module 700 may be changed from the first state 1101 to a second state 1102. For example, as the camera module 700 in the first state 1101 performs linear motion in the third direction (refer to FIG. 4), the camera module 700 in the first state 1101 may be changed to the second state 1102 in which at least part of the camera module 700 protrudes to a second position outside the housing 100 by a first stroke A. In this regard, when the side member 130 is viewed in the opposite direction to the third direction, an opening through which the camera module 700 protrudes may be formed in one area of the side member 130 that corresponds to the position of the camera module 700, and at least part of the camera module 700 may be exposed through the opening. In an embodiment, in the case where the camera module 700 is in the second state 1102, the display 200 and at least part of a rear surface of the camera module 700 in the second state 1102 may be visible when the electronic device 1000 is viewed in the second direction. Furthermore, in the case where the camera module 700 is in the second state 1102, the second plate 120 and at least part (e.g., at least one lens 701) of a front surface of the camera module 700 in the second state 1102 may be visible when the electronic device 100 is viewed in the first direction (refer to FIG. 1).

In an embodiment, the camera module 700 may be changed from the second state 1102 to a third state 1103. For example, as the camera module 700 in the second state 1102 performs rotary motion in one direction while performing linear motion in the third direction (or, after performing the linear motion with specified momentum), the camera module 700 in the second state 1102 may further protrude by a second stroke B, and the at least one lens 701 facing the second direction (or, the back of the electronic device 1000) may be changed to the third state 1103 to face the first direction (or, the front of the electronic device 1000). In an embodiment, in the case where the camera module 700 is in the third state 1103, the display 200 and at least part (e.g., the at least one lens 701) of the front surface of the camera module 700 in the third state 1103 may be visible when the electronic device 1000 is viewed in the second direction. Furthermore, in the case where the camera module 700 is in the third state 1103, the second plate 120 and at least part of the rear surface of the camera module 700 in the third state 1103 may be visible when the electronic device 1000 is viewed in the first direction.

Figure 12:
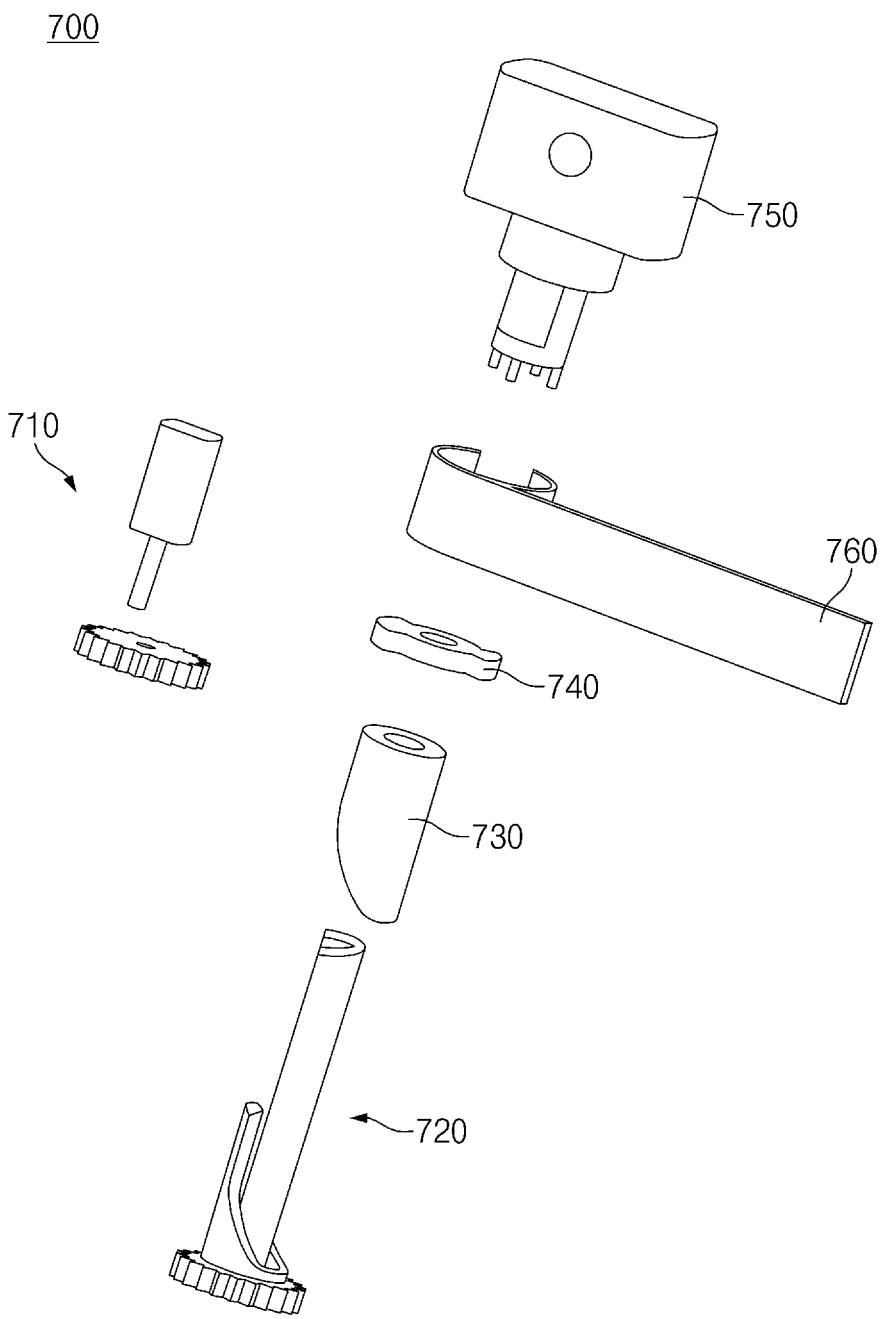
FIG. 12 is a view illustrating a configuration of the camera module according to the other embodiment.

FIG. 12 is a view illustrating a configuration of the camera module according to the other embodiment. FIG. 12 may be described by being referred to overall together the following drawings.

Figure 13:
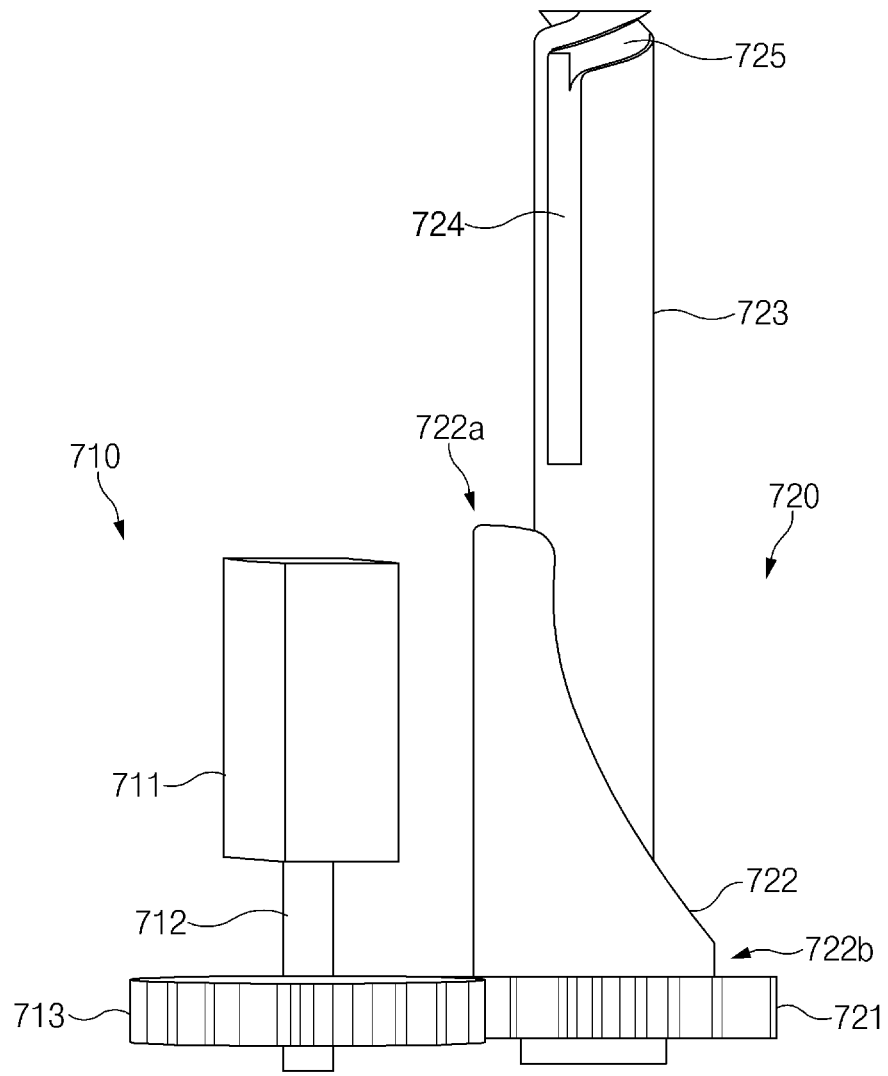
FIG. 13 is a view illustrating a power unit and a cam structure according to an embodiment.
Figure 14:
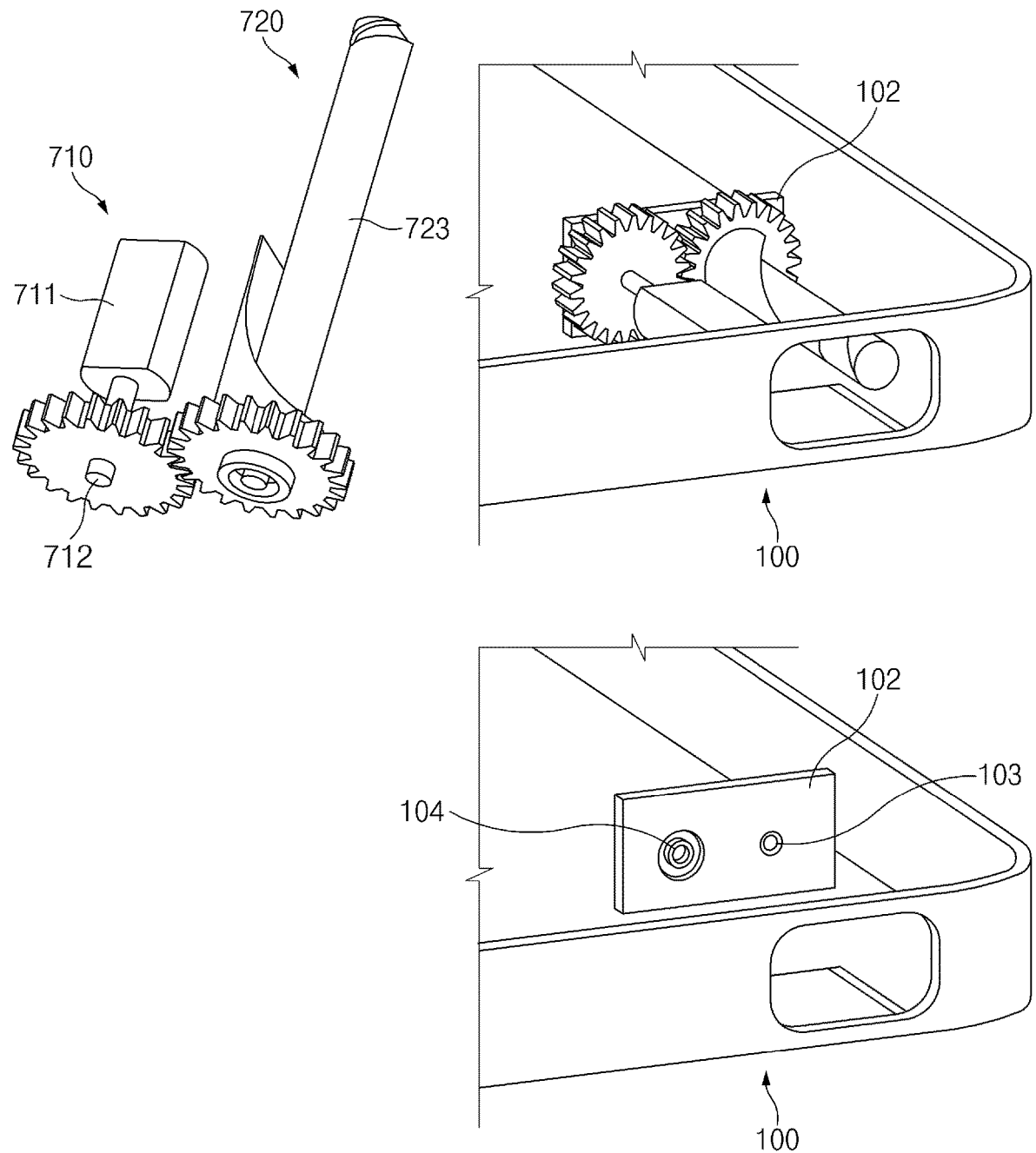
FIG. 14 is a view illustrating a form in which the power unit and the cam structure are fixed inside a housing according to an embodiment.

FIG. 13 is a view illustrating a power unit and a cam structure according to an embodiment, and FIG. 14 is a view illustrating a form in which the power unit and the cam structure are fixed inside the housing according to an embodiment.

Referring to FIGS. 12 and 13, the camera module 700 according to the other embodiment may include the power unit 710 and the cam structure 720.

The power unit 710 may provide power for motion of the camera module 700. In this regard, the power unit 710 may include a motor 711, a rotary shaft 712, and a first gear 713. In certain embodiments, the motor 711 may operate in response to a user input to a menu provided by an application program (e.g., a camera application program) included in the electronic device 1000 (refer to FIG. 10 or 11), or may operate in response to a user input to a hardware button provided in one area of the electronic device 1000. In an embodiment, one end of the rotary shaft 712 may be connected to the motor 711, and an opposite end of the rotary shaft 712 may be fixed to the first gear 713 in a form of passing through the first gear 713. Accordingly, when the motor 711 operates, the rotary shaft 712 connected to the motor 711 may rotate in one direction, and the first gear 713 may rotate in the same direction to correspond to the rotation of the rotary shaft 712 in the one direction. According to certain embodiments, the power unit 710 may further include, between the motor 711 and the first gear 713, a reduction gear for controlling the rotational speed or the number of revolutions of the first gear 713.

Part of the cam structure 720 may perform rotary motion by torque provided from the power unit 710. In this regard, the cam structure 720 may include a second gear 721, a first cam 722, and a shaft 723. In an embodiment, the second gear 721 may be disposed to be engaged with the first gear 713 of the power unit 710 and may rotate in an opposite direction as the first gear 713 rotates in one direction. In an embodiment, the first cam 722 may be formed in a cylindrical shape, one area of which is integrally formed with the second gear 721. The first cam 722 may rotate together as the second gear 721 rotates in the opposite direction. In certain embodiments, the second gear 721 may be included as part of the first cam 722.

According to an embodiment, the first cam 722 may include a first area 722a and a second area 722b that are continuous with each other. In an embodiment, an area extending from the first area 722a to the second area 722b (or, an area extending from the second area 722b to the first area 722a) may have a gradual slope (e.g., a first slope) such that the first area 722a further protrudes beyond the second area 722b in the third direction.

In an embodiment, the shaft 723 may be disposed to pass through the second gear 721 but so as not to be physically connected with the first cam 722 and the second gear 721. Accordingly, even when the second gear 721 and the first cam 722, which is integrated with the second gear 721, perform rotary motion, the shaft 723 may maintain the state thereof without separate rotary motion. In an embodiment, the shaft 723 may include, at a specified height in the third direction with respect to the second gear 721, a first groove 724 extending in the third direction and may include, on a distal end area thereof, a screw-shaped second groove 725 that is continuous with the first groove 724.

Referring to FIGS. 12 and 14, the rotary shaft 712 of the power unit 710 and the shaft 723 of the cam structure 720 may be inserted into, or fixed to, a first structure 102 that is formed in the interior of the housing 100 in which the camera module 700 is disposed (e.g., in the interior of the housing 100 that corresponds to the arrangement area of the camera module 700 illustrated in FIG. 10). For example, in the state in which the one end of the rotary shaft 712 of the power unit 710 is connected to the motor 711, the opposite end of the rotary shaft 712 may be inserted into a first recess 104 formed on the first structure 102. For example, in the state in which the shaft 723 of the cam structure 720 is not physically connected with the second gear 721 (refer to FIG. 13) and the first cam 722 (refer to FIG. 13), the shaft 723 of the cam structure 720 may be fixedly inserted into a second recess 103 formed on the first structure 102.

Figure 15:
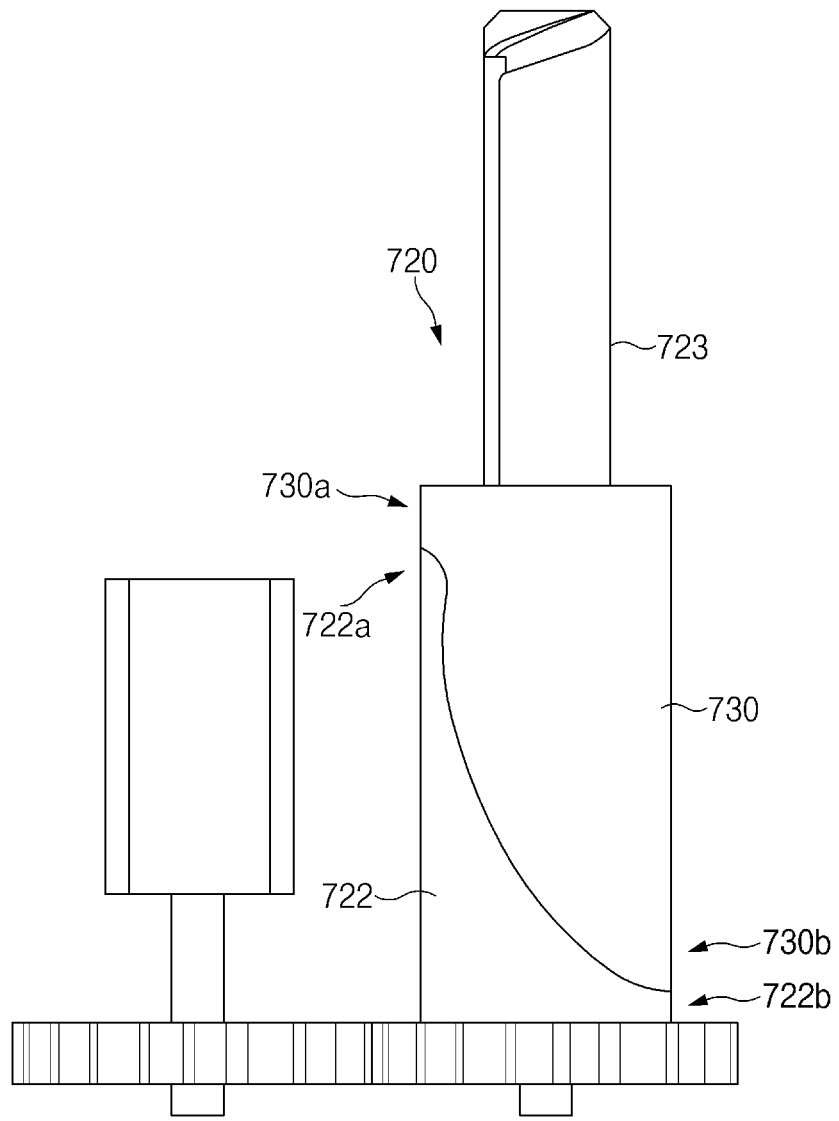
FIG. 15 is a view illustrating a form in which the cam structure and a second cam are coupled according to an embodiment.
Figure 16:
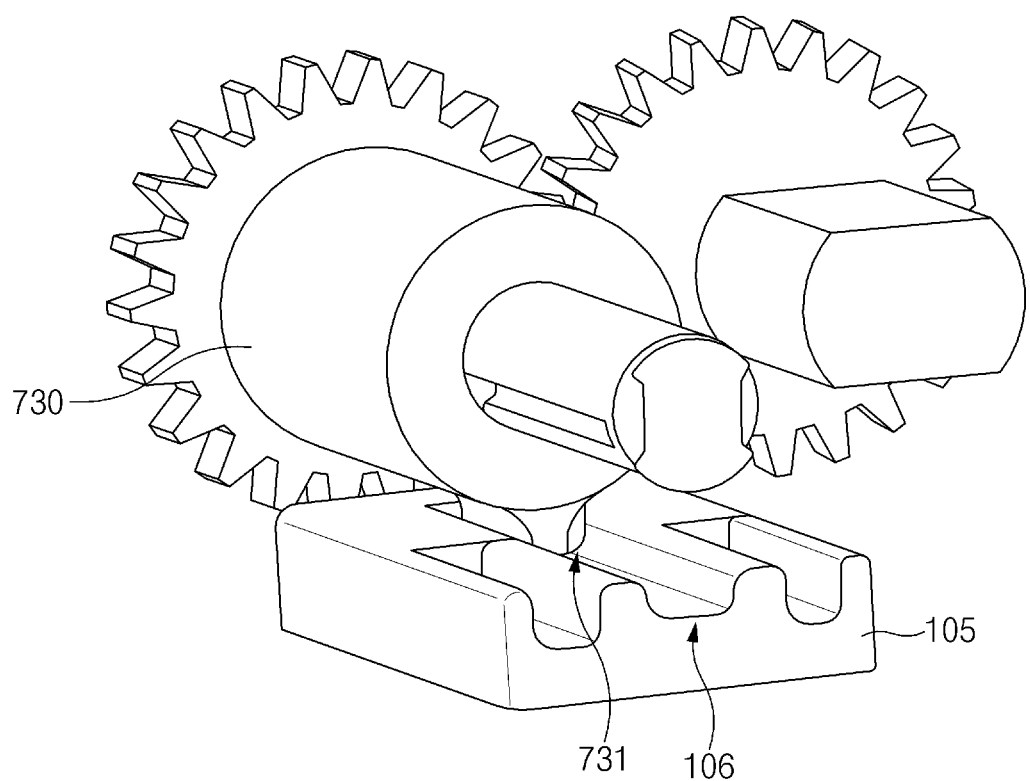
FIG. 16 is a view illustrating a form in which the second cam is disposed inside the housing according to an embodiment.

FIG. 15 is a view illustrating a form in which the cam structure and a second cam are coupled according to an embodiment, and FIG. 16 is a view illustrating a form in which the second cam is disposed inside the housing according to an embodiment.

Referring to FIGS. 12, 15, and 16, the camera module 700 (refer to FIG. 10, 11, or 12) according to the other embodiment may include the second cam 730 mounted on the shaft 723 of the cam structure 720 and engaged with the first cam 722 of the cam structure 720. According to an embodiment, the second cam 730 may be formed in a cylindrical shape corresponding to the first cam 722. For example, the second cam 730 may include a third area 730a in contact with the first area 722a of the first cam 722 and a fourth area 730b in contact with the second area 722b of the first cam 722, and an area extending from the third area 730a to the fourth area 730b (or, an area extending from the fourth area 730b to the third area 730a) may have a gradual slope (e.g., a second slope) such that the fourth area 730b further protrudes beyond the third area 730a in the opposite direction to the third direction (refer to FIG. 4). In an embodiment, the gradual slope (e.g., the first slope) formed on the first cam 722 and the gradual slope (e.g., the second slope) formed on the second cam 730 may be the same as, or similar to, each other such that the first cam 722 and the second cam 730 are engaged with each other.

According to an embodiment, rotation of the second cam 730 on the cam structure 720 may be suppressed. In this regard, the second cam 730 may include a protrusion 731 that protrudes from one area of an outer surface of the second cam 730. In an embodiment, the protrusion 731 may be received in a third groove 106 included in a second structure 105 formed inside the housing 100 (refer to FIG. 14) and may suppress rotation of the second cam 730.

Figure 17:
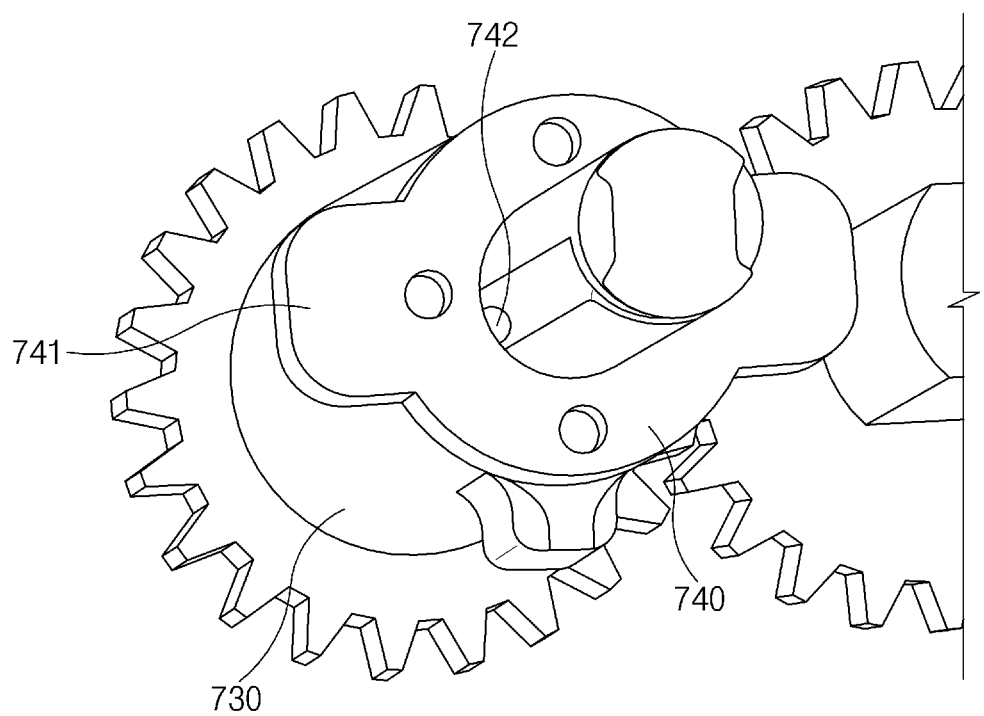
FIG. 17 is a view illustrating a form in which the second cam and a third cam are coupled according to an embodiment.
Figure 18:
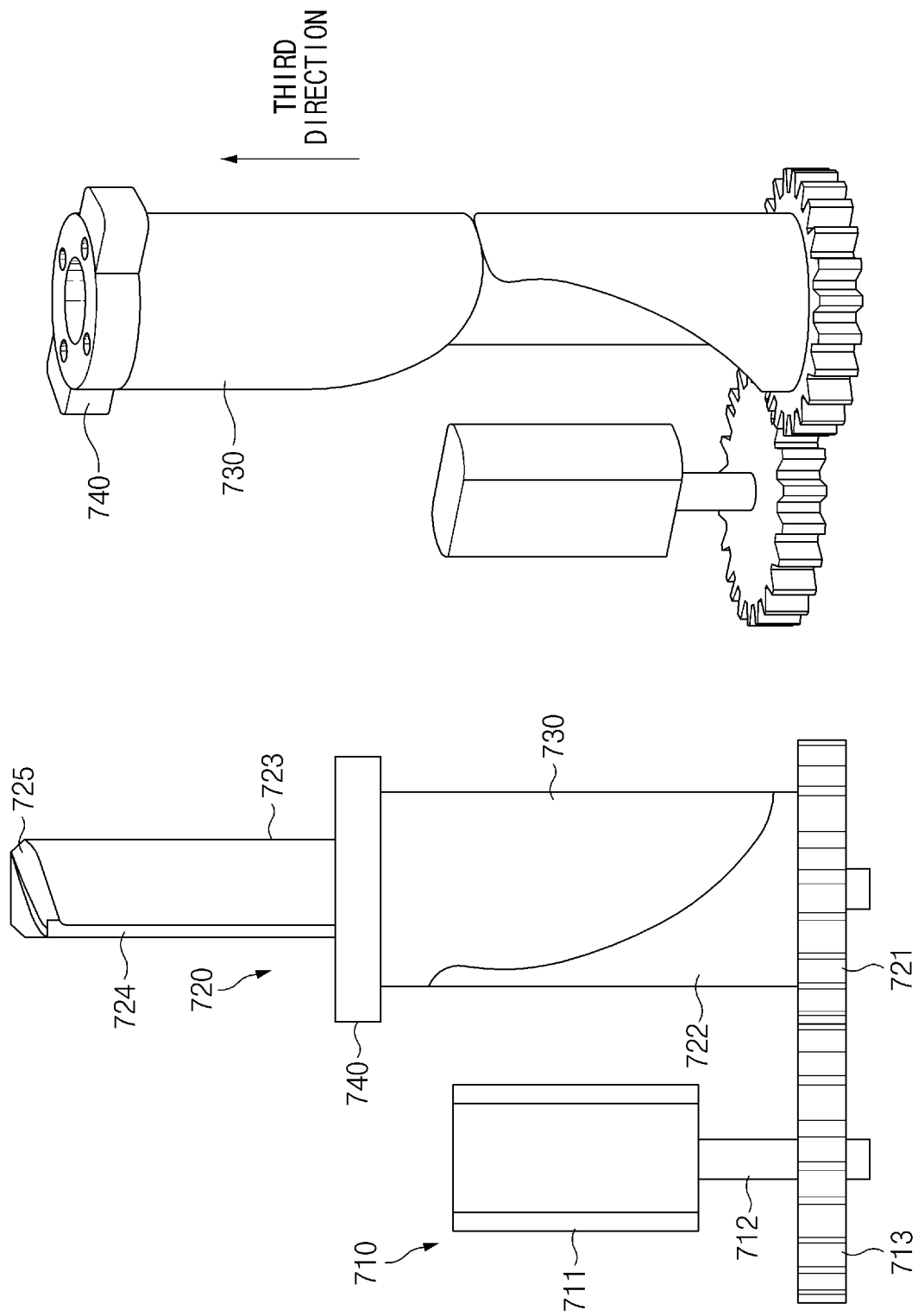
FIG. 18 is a view illustrating a form in which the power unit, the cam structure, the second cam, and the third cam perform motion according to an embodiment.
Figure 19:
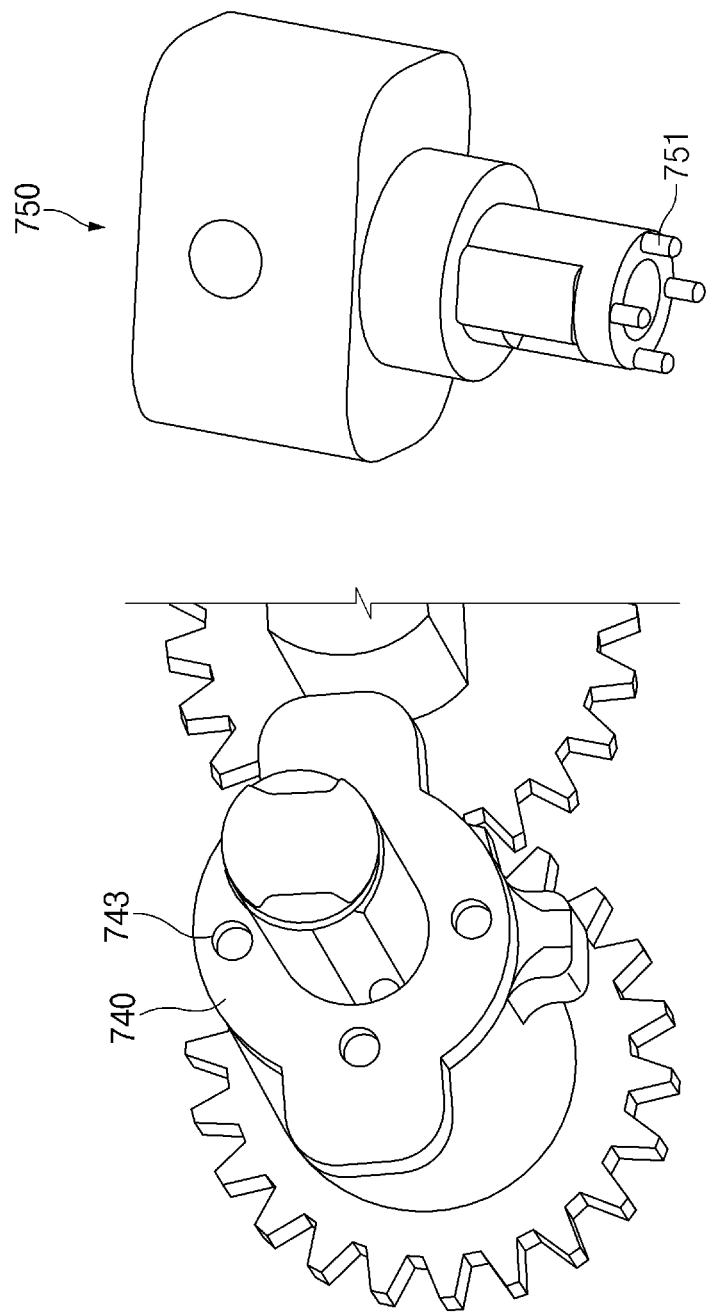
FIG. 19 is a view illustrating a form in which the third cam and a lens structure are coupled according to an embodiment.

FIG. 17 is a view illustrating a form in which the second cam and a third cam are coupled according to an embodiment. FIG. 18 is a view illustrating a form in which the power unit, the cam structure, the second cam, and the third cam perform motion according to an embodiment. FIG. 19 is a view illustrating a form in which the third cam and a lens structure are coupled according to an embodiment.

Referring to FIGS. 12, 17, and 18, the camera module 700 (refer to FIG. 10, 11, or 12) according to the other embodiment may include the third cam 740 mounted on the shaft 723 of the cam structure 720 and disposed on an upper portion (e.g., an upper portion in the third direction) of the second cam 730. In an embodiment, the third cam 740 may include at least one first protrusion 741 protruding from an outer surface of the third cam 740 and a second protrusion 742 protruding from an inner surface of the third cam 740. According to an embodiment, the second protrusion 742 may be inserted into the first groove 724 included in the shaft 723 of the cam structure 720 and may be guided along the first groove 724 and the screw-shaped second groove 725 that is continuous with the first groove 724.

A cooperative operation between the power unit 710, the cam structure 720, the second cam 730, and the third cam 740 that are included in the camera module 700 will be described. When the motor 711 of the power unit 710 operates, the rotary shaft 712 connected with the motor 711 may rotate in one direction, and the first gear 713 fixed to the rotary shaft 712 may rotate in the same direction to correspond to the rotation of the rotary shaft 712 in the one direction. In an embodiment, the second gear 721 of the cam structure 720 that is engaged with the first gear 713 may rotate in an opposite direction to correspond to the rotation of the first gear 713 in the one direction, and the first cam 722 integrally formed with the second gear 721 may rotate in the same direction together with the second gear 721. In this operation, the shaft 723 of the cam structure 720 may not separately rotate because the shaft 723 of the cam structure 720 is not physically connected with the first cam 722 and the second gear 721 and is fixed to the second recess 103 (refer to FIG. 14) of the first structure 102 (refer to FIG. 14) that is formed inside the housing 100 (refer to FIG. 14).

In an embodiment, the rotary motion of the first cam 722 may be associated with linear motion of the second cam 730, which is engaged with the first cam 722, in the third direction. For example, the rotary motion of the first cam 722 may release the engagement between the first cam 722 and the second cam 730, and accordingly the first cam 722 may press the second cam 730 in the third direction to allow the second cam 730 to perform linear motion. In this operation, the protrusion 731 (refer to FIG. 16) that protrudes from the outer surface of the second cam 730 may be guided along the third groove 106 (refer to FIG. 16) of the second structure 105 (refer to FIG. 16) that is formed inside the housing 100. The linear motion of the second cam 730 may be implemented by the protrusion 731, but rotary motion of the second cam 730 may be suppressed by the protrusion 731.

In an embodiment, the linear motion of the second cam 730 in the third direction may press the third cam 740, which is disposed on the upper portion of the second cam 730, in the third direction. In this case, the second protrusion 742 (refer to FIG. 17), which protrudes from the inner surface of the third cam 740, may be guided by the first groove 724 formed on the shaft 723 of the cam structure 720, and the third cam 740 may perform linear motion in the third direction. According to an embodiment, when the second protrusion 742 of the third cam 740 enters the screw-shaped second groove 725 that is continuous with the first groove 724 formed on the shaft 723, the third cam 740 may perform rotary motion while performing the linear motion (or, after performing the linear motion).

Referring to FIGS. 12, 18, and 19, the camera module 700 according to the other embodiment may include the lens structure 750 that is fixed to the third cam 740 and that operates in conjunction with the third cam 740. According to an embodiment, a plurality of protrusions 751 that support fixing the lens structure 750 to the third cam 740 may be included in a lower end area of the lens structure 750, and correspondingly a plurality of recesses 743 for receiving and fixing the plurality of protrusions 751 may be included in an upper surface area of the third cam 740.

In an embodiment, the linear motion and the rotary motion of the third cam 740 may be associated with linear motion and rotary motion of the lens structure 750 fixed to the third cam 740. For example, when the third cam 740 performs the linear motion in the third direction along the first groove 724 formed on the shaft 723, the lens structure 750 fixed to the third cam 740 may perform linear motion in the third direction, and at least part of the lens structure 750 may protrude outside the housing 100 by a first stroke (e.g., the stroke A of FIG. 11). In an embodiment, when the linear motion of the third cam 740 in the third direction is converted into linear motion and rotary motion by the second groove 725 formed on the shaft 723, the lens structure 750 may perform rotary motion while performing linear motion, and the at least part of the lens structure 750 that protrudes outside the housing 100 may rotate while further protruding by a second stroke (e.g., the stroke B of FIG. 11).

Figure 20:
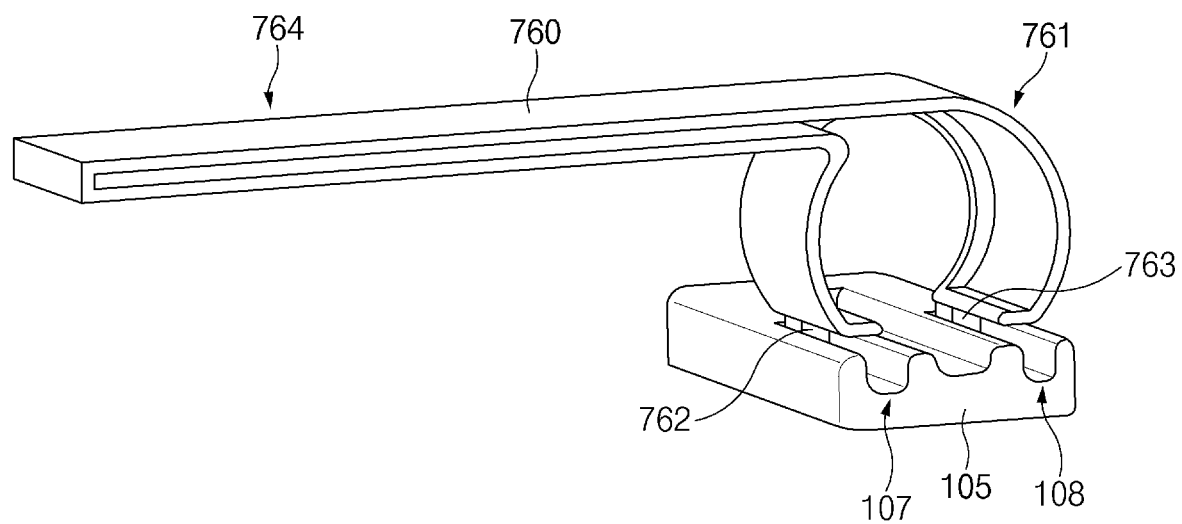
FIG. 20 is a view illustrating a form in which a flexible printed circuit board frame is fixed inside the housing according to an embodiment.
Figure 21:
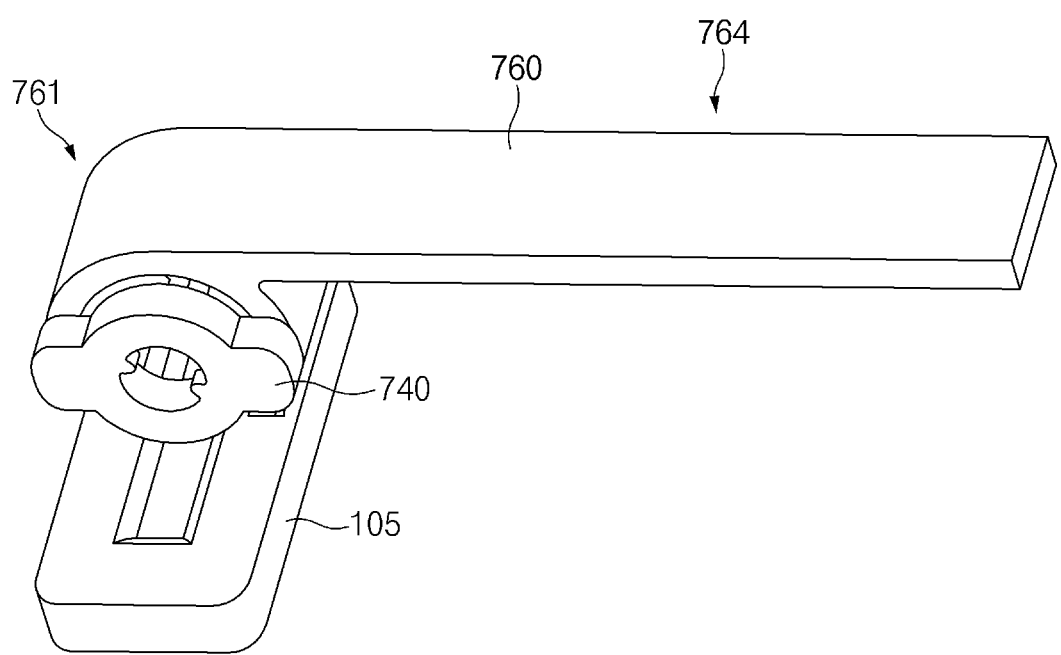
FIG. 21 is a view illustrating a form in which the flexible printed circuit board frame and the third cam are disposed according to an embodiment.
Figure 22:
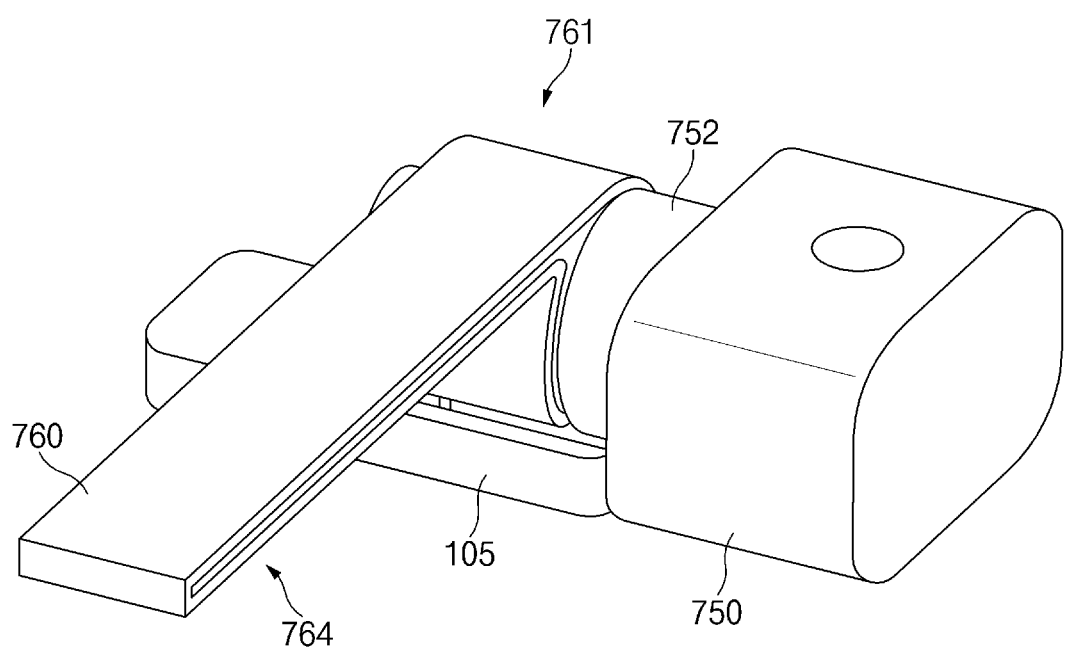
FIG. 22 is a view illustrating a form in which the flexible printed circuit board frame and the lens structure are disposed according to an embodiment.

FIG. 20 is a view illustrating a form in which a flexible printed circuit board frame is fixed inside the housing according to an embodiment. FIG. 21 is a view illustrating a form in which the flexible printed circuit board frame and the third cam are disposed according to an embodiment. FIG. 22 is a view illustrating a form in which the flexible printed circuit board frame and the lens structure are disposed according to an embodiment.

Referring to FIGS. 12, 20, 21, and 22, the camera module 700 (refer to FIG. 10, 11, or 12) according to the other embodiment may further include the flexible printed circuit board frame 760 that shields or receives at least part of a flexible printed circuit board for electrically connecting the lens structure 750 (refer to FIG. 19) and the printed circuit board 300 (refer to FIG. 1). In an embodiment, the flexible printed circuit board frame 760 may include an annular area 761 that is open toward the first direction (refer to FIG. 1) and a planar area 764 that extends from the annular area 761 toward the printed circuit board 300.

In an embodiment, the annular area 761 may include a pair of distal ends 762 and 763 facing each other, depending on the opening toward the first direction. For example, the pair of distal ends 762 and 763 may be received in a fourth groove 107 and a fifth groove 108 of the second structure 105 formed inside the housing 100 (refer to FIG. 14). According to an embodiment, the third groove 106 (refer to FIG. 16), in which the protrusion 731 (refer to FIG. 16) of the second cam 730 (refer to FIG. 16) is received, may be present between the fourth groove 107 and the fifth groove 108 on the second structure 105.

In an embodiment, the third cam 740 may be disposed on a lower side of the annular area 761 of the flexible printed circuit board frame 760 (e.g., in the opposite direction to the third direction of FIG. 18). When the third cam 740 performs linear motion in the third direction, at least part (e.g., the at least one protrusion 741 of FIG. 17) of the third cam 740 may press the flexible printed circuit board frame 760 in the third direction. Accordingly, the pair of distal ends 762 and 763 included in the annular area 761 of the flexible printed circuit board frame 760 may be guided in the third direction along the fourth groove 107 and the fifth groove 108 of the second structure 105, and the flexible printed circuit board frame 760 may perform linear motion in the third direction.

In an embodiment, at least part of the lens structure 750 passing through the annular area 761 may be disposed on an upper side of the annular area 761 of the flexible printed circuit board frame 760 (e.g., in the third direction). For example, a step area 752 included in the lens structure 750 may be disposed on the upper side of the annular area 761, and the annular area 761 and a lower surface of the step area 752 may overlap each other. Accordingly, when the lens structure 750 performs linear motion in the direction (hereinafter, referred to as the fourth direction) that is opposite to the third direction, at least part of the step area 752 of the lens structure 750 may press the flexible printed circuit board frame 760 in the fourth direction. In an embodiment, when the step area 752 presses the flexible printed circuit board frame 760, the pair of distal ends 762 and 763 included in the annular area 761 may be guided in the fourth direction along the fourth groove 107 and the fifth groove 108 of the second structure 105, and the flexible printed circuit board frame 760 may perform linear motion in the fourth direction.

Figure 23:
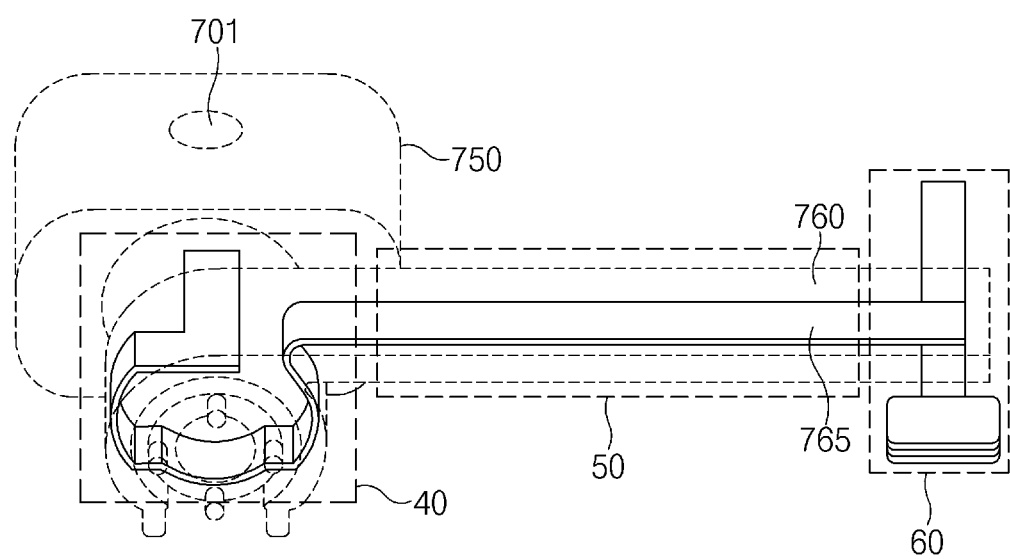
FIG. 23 is a view illustrating the shape of a flexible printed circuit board when the camera module according to the other embodiment is in a first state.
Figure 24:
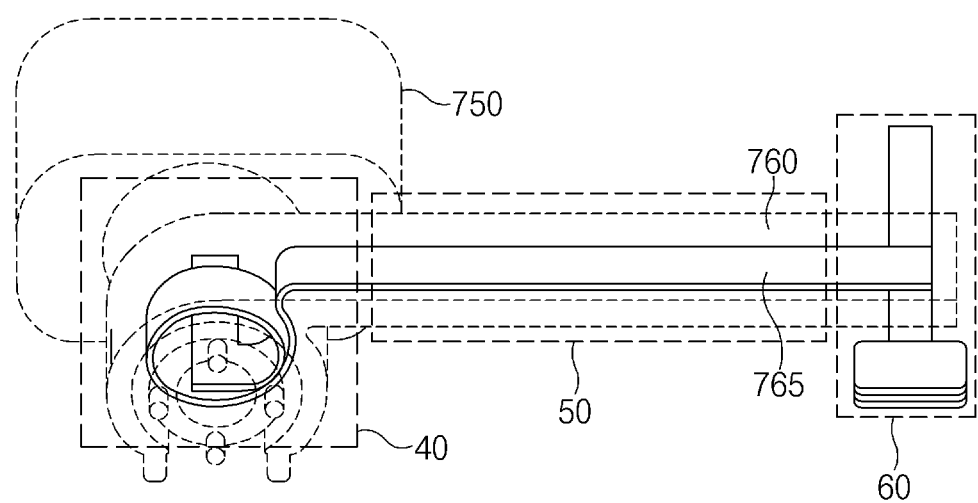
FIG. 24 is a view illustrating the shape of the flexible printed circuit board when the camera module according to the other embodiment is in a second state.

FIG. 23 is a view illustrating the shape of a flexible printed circuit board when the camera module according to the other embodiment is in the first state, and FIG. 24 is a view illustrating the shape of the flexible printed circuit board when the camera module according to the other embodiment is in the second state.

Referring to FIGS. 22, 23, and 24, the flexible printed circuit board frame 760 may shield or receive at least part of the flexible printed circuit board 765 that electrically connects the lens structure 750 and the printed circuit board 300 (refer to FIG. 1). For example, a rollable portion 40 of the flexible printed circuit board 765 may be received or shielded by the annular area 761 (refer to FIG. 22) of the flexible printed circuit board frame 760. Furthermore, at least part of a connecting portion 50 and a movable portion 60 of the flexible printed circuit board 765 may be received or shielded by the planar area 764 (refer to FIG. 23) that extends from the annular area 761.

In an embodiment, the rollable portion 40 may include one distal end of the flexible printed circuit board 765 that is connected with the lens structure 750 and a rollable area continuous with the one distal end. In an embodiment, as the camera module 700 (refer to FIG. 10, 11, or 12) performs rotary motion in one direction, the rollable area may be rolled in the same direction, and as the camera module 700 performs rotary motion in an opposite direction, the rollable area may be unrolled in the same direction. The movable portion 60 may include an opposite distal end of the flexible printed circuit board 765 that is electrically connected with the printed circuit board 300 and a curved area continuous with the opposite distal end. In an embodiment, the position of the curved area of the movable portion 60 may be changed depending on linear motion of the camera module 700 (or, the lens structure 750) in the third direction (refer to FIG. 18). The connecting portion 50 may connect the rollable portion 40 and the movable portion 60. For example, the connecting portion 50 may connect a distal end of the rollable portion 40 that is continuous with the rollable area and a distal end of the movable portion 60 that is continuous with the curved area. In an embodiment, at least part of the connecting portion 50 may be fixed to the planar area 764 of the flexible printed circuit board frame 760 so as to suppress pitch or distortion of the flexible printed circuit board 765 due to rolling or unrolling of the rollable area or a change in the position of the curved area.

According to an embodiment, when the camera module 700 is in the first state 1101 (refer to FIG. 11) or the second state 1102 (refer to FIG. 11), the rollable area included in the rollable portion 40 of the flexible printed circuit board 765 may remain unrolled in the annular area of the flexible printed circuit board frame 760. Furthermore, when the camera module 700 is in the first state, the curved area of the movable portion 60 may be located in a first position spaced apart from the connecting portion 50 by a specified first distance, and when the camera module 700 performs linear motion to change from the first state to the second state, the curved area of the movable portion 60 may be located in a second position spaced apart from the connecting portion 50 by a specified second distance (e.g., a distance shorter than the first distance).

In an embodiment, when the camera module 700 is changed from the second state to the third state 1103 (refer to FIG. 11), the rollable area may remain rolled in the annular area of the flexible printed circuit board frame 760 as the lens structure 750 performs rotary motion and the one distal end of the flexible printed circuit board 765, which is connected to the lens structure 750, and the rollable area rotate. Furthermore, when the camera module 700 is changed from the second state to the third state, the curved area of the movable portion 60 may be located in a third position spaced apart from the connecting portion 50 by a specified third distance (e.g., a distance shorter than the second distance) as the lens structure 750 performs linear motion while performing the rotary motion.

According to certain embodiments, the sequence of rolling or unrolling of the flexible printed circuit board 765 depending on a state change of the camera module 700 may be modified. For example, when the camera module 700 is in the first state or the second state, the rollable area included in the rollable portion 40 of the flexible printed circuit board 765 may remain rolled, and when the camera module 700 is changed from the second state to the third state, the rollable area may remain unrolled.

Figure 25:
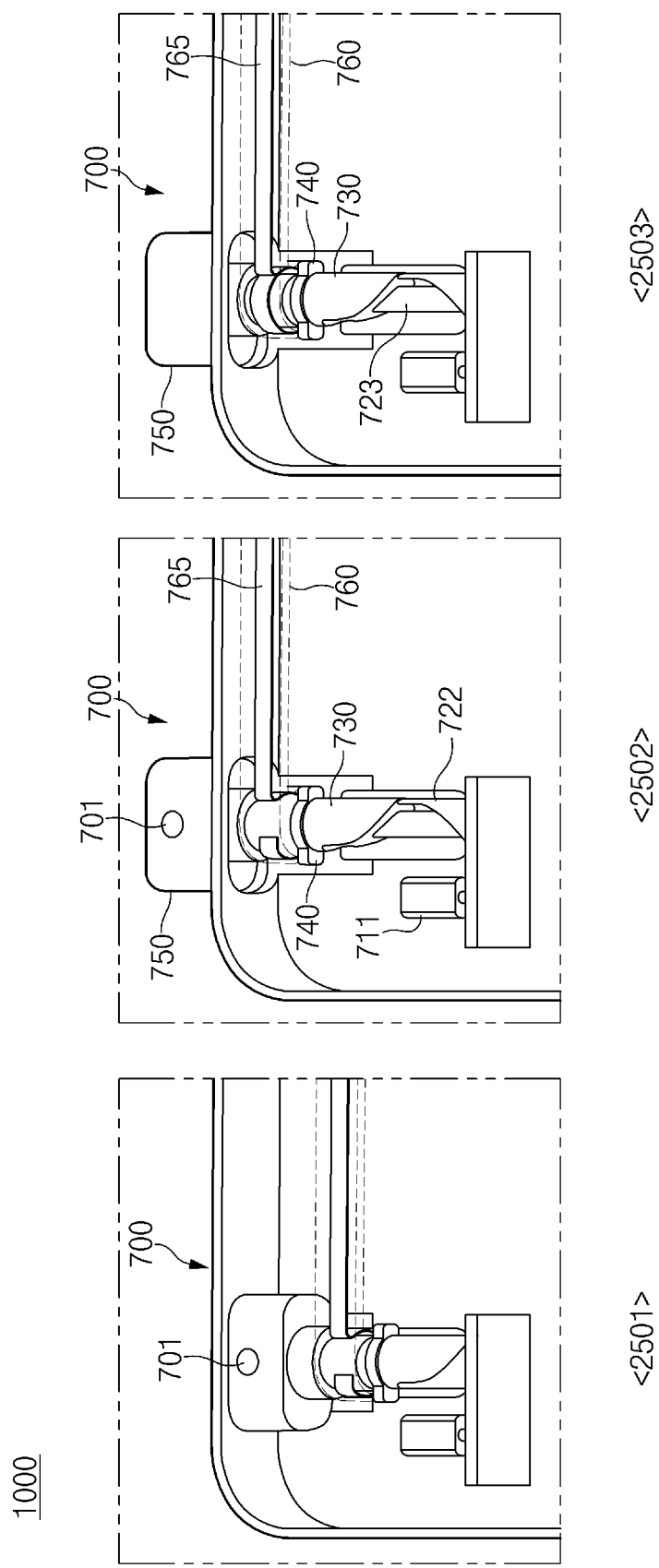
FIG. 25 is a view illustrating a form in which the camera module according to the other embodiment performs motion.

FIG. 25 is a view illustrating a form in which the camera module according to the other embodiment performs motion.

Referring to FIG. 25, the camera module 700 according to the other embodiment may be operated between a first state 2501 in which the camera module 700 is disposed inside the electronic device 1000 and shielded from the outside, a second state 2502 in which the camera module 700 at least partially protrudes outside the electronic device 1000 and supports taking an image of a subject behind the electronic device 1000, and a third state 2503 in which the camera module 700 further protrudes outward than in the second state 2502 and supports taking an image of a subject in front of the electronic device 1000. According to an embodiment, the at least one lens 701 included in the camera module 700 in the first state 2501 may face the second direction (refer to FIG. 1) (or, the back of the electronic device 1000) inside the electronic device 1000.

In an embodiment, the camera module 700 in the first state 2501 may perform linear motion in the third direction (refer to FIG. 4) and may be changed to the second state 2502. For example, when the motor 711 operates, the first cam 722 may rotate in one direction in conjunction with the operation of the motor 711, and the rotation of the first cam 722 may be associated with linear motion of the second cam 730 in the third direction by pressing the second cam 730 engaged with the first cam 722. In an embodiment, the linear motion of the second cam 730 in the third direction may press the third cam 740, which is disposed on the upper portion of the second cam 730, in the third direction, and accordingly the third cam 740 may perform linear motion in the third direction while being guided by the first groove 724 (refer to FIG. 13) that is formed on the shaft 723. As the third cam 740 performs the linear motion in the third direction, at least part of the lens structure 750 fixed to the third cam 740 may protrude outside the electronic device 1000 by a first stroke (e.g., the stroke A of FIG. 11) through the opening formed in the corresponding position on the side member 130 (refer to FIG. 11). Accordingly, the camera module 700 may be changed to the second state 2502. According to an embodiment, in the operation in which the camera module 700 is changed to the second state 2502, the flexible printed circuit board frame 760 disposed on the third cam 740 (e.g., in the third direction) may be pressed by the linear motion of the third cam 740 to perform linear motion in the third direction, and the flexible printed circuit board 765 in the flexible printed circuit board frame 760 may remain unrolled.

In an embodiment, the camera module 700 in the second state 2502 may be changed to the third state 2503 by linear motion and rotary motion in the third direction. For example, when the third cam 740 additionally performs linear motion and is guided by the screw-shaped second groove 725 (refer to FIG. 13), which is formed on the distal end area of the shaft 723, the third cam 740 may perform linear motion and rotary motion along the second groove 725. In this case, the lens structure 750 fixed to the third cam 740 may further protrude outside the electronic device 1000 by a second stroke (e.g., the stroke B of FIG. 11), and the at least one lens 701 facing the second direction may rotate to face the first direction (refer to FIG. 1) (or, the front of the electronic device 1000). Accordingly, the camera module 700 may be changed to the third state 2503. According to an embodiment, in the operation in which the camera module 700 is changed to the third state 2503, the flexible printed circuit board frame 760 may additionally perform linear motion in the third direction, and one area of the flexible printed circuit board 765 connected to the lens structure 750 may be changed to a rolled state to correspond to rotation of the lens structure 750.

Figure 26:
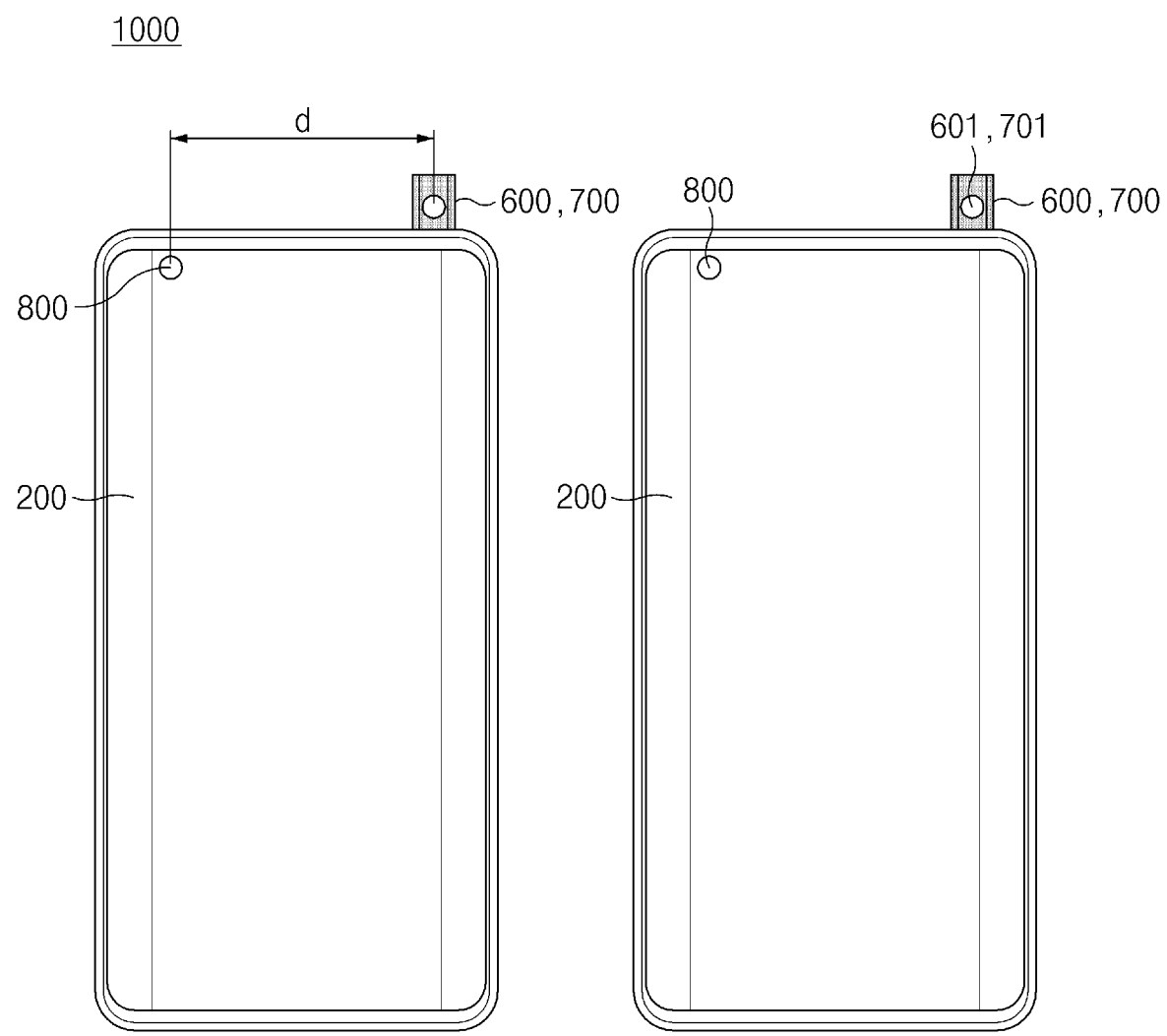
FIG. 26 is a view illustrating an electronic device including a plurality of camera modules according to an embodiment.

FIG. 26 is a view illustrating an electronic device including a plurality of camera modules according to an embodiment.

Referring to FIG. 26, the electronic device 1000 according to certain embodiments may include the plurality of camera modules. For example, the electronic device 1000 may include a first camera module (e.g., the camera module 600 of FIGS. 1 to 9 or the camera module 700 of FIGS. 10 to 25) that performs linear motion and/or rotary motion between a first position corresponding to the inside of the housing 100 (refer to FIG. 1) and a second position corresponding to the outside of the housing 100. Furthermore, the electronic device 1000 may include a second camera module 800 exposed to the outside through the front surface of the electronic device 1000 (or, exposed to the outside through the display 200). In an embodiment, the first camera module 600 or 700 may support taking images of subjects ahead of and behind the electronic device 1000, based on the linear motion and/or the rotary motion, and the second camera module 800 may support taking an image of a subject in front of the electronic device 1000.

According to an embodiment, when at least part of the first camera module 600 or 700 protrudes outward from the electronic device 1000 and is located in the second position, the first camera module 600 or 700 and the second camera module 800 may form a predetermined separation distance "d". In an embodiment, the first camera module 600 or 700 and the second camera module 800 may include lenses having different properties so as to have different fields of view depending on the separation distance "d". For example, the uppermost lens facing the third direction (refer to FIG. 4) among the at least one lens 601 or 701 included in the first camera module 600 or 700 may include a tele lens, and the second camera module 800 may include a lens having an optical property.

In an embodiment, in a case of taking an image of a subject in front of the electronic device 1000 by using the first camera module 600 or 700 and the second camera module 800, an image including depth information may be taken by the tele lens included in the first camera module 600 or 700 or the optical lens included in the second camera module 800, and the electronic device 1000 may generate various 3D contents using the image including the depth information.

In certain embodiments, when the electronic device 1000 includes only the first camera module 600 or 700, exclusive of the second camera module 800, the uppermost lens facing the third direction among the at least one lens 601 or 701 included in the first camera module 600 or 700 may include a lens having an optical property.

An electronic device according to certain embodiments may include a housing including a first plate facing a first direction, a second plate facing a second direction opposite to the first direction, and a side member surrounding a space between the first plate and the second plate; a camera module having a lens structure comprising one or more lenses, configured to move from a first position to a second position and vice versa, wherein in the first position, the lens structure faces the second direction and is disposed inside the space, wherein in the second position, the lens structure protrudes from the side member and faces the first direction; a printed circuit board disposed in the space; and a flexible printed circuit board connecting the camera module and the printed circuit board.

According to certain embodiments, the flexible printed circuit board includes a rollable portion including a first distal end of the flexible printed circuit board connected to one area of the camera module and a rollable area, wherein the rollable area wraps around the one area of the camera module when the camera module moves from the second position to the first position and unwraps when the camera module moves from the first position to the second position; a movable portion including a curved area and a second distal end of the flexible printed circuit board, wherein the second distal end extends from the curved area and is connected to the printed circuit board; and a connecting portion connecting the rollable area and the movable portion.

According to certain embodiments, the camera module includes a flexible printed circuit board frame configured to receive or shield at least part of the flexible printed circuit board, and the flexible printed circuit board frame includes: a cylindrical area configured to receive or shield at least part of the rollable portion; and a planar area configured to receive or shield at least part of the movable portion and at least part of the connecting portion.

According to certain embodiments, the at least part of the connecting portion is fixed to the planar area of the flexible printed circuit board frame.

According to certain embodiments, when the camera module is located in the first position, the curved area is located at a first distance from the connecting portion, and wherein when the camera module is located in the second position, the curved area is located at a second distance from the connecting portion, the second distance being shorter than the first distance.

According to certain embodiments, the second plate includes a first opening, and when the camera module is in the first position the first opening exposes at least one lens of the one or more lenses of the lens structure, and wherein the side member includes a second opening through which the lens structure protrudes when the camera module is in the second position.

According to certain embodiments, the camera module includes a first shaft rotably connected with a motor, the first shaft including a first thread on at least part of an outer surface thereof; a first bracket configured to move in a third direction substantially orthogonal to the first direction and the second direction along the first shaft, when the first shaft rotates; a cylindrical cam configured to rotate while moving in the third direction, when the first bracket moves in the third direction; and wherein the lens structure is connected to the cylindrical cam.

According to certain embodiments, the first bracket includes a first through-hole including a second thread on an inner surface thereof, the second thread of the first bracket mating with the first thread of the first shaft.

According to certain embodiments, the housing further includes a support member connected to the side member, wherein the first bracket includes a second through-hole, and wherein the camera module further includes a second shaft configured to pass through the second through-hole and fixed to a second bracket and the side member.

According to certain embodiments, the first bracket further includes a third through-hole, and wherein the camera module further includes a third shaft configured to pass through the third through-hole and connect the cylindrical cam and the lens structure.

According to certain embodiments, the third shaft includes a plurality of protruding rings configured to constrain the first bracket, through which the third shaft passes, in the third direction, and wherein the cylindrical cam includes, on at least part of an outer surface thereof, a screw-shaped groove receiving at least part of a protrusion formed on the support member.

According to certain embodiments, at least one of the plurality of protruding rings is pressed by the first bracket and configured to move in the third direction, causing the third shaft to move in the third direction, and wherein the protrusion causes the cylindrical cam to rotate, while moving in the third direction.

According to certain embodiments, the third shaft rotates to correspond to the rotation of the cylindrical cam, and wherein the third shaft causes the lens structure to rotate while moving in the third direction.

According to certain embodiments, the camera module includes: a first cam rotably connected with a motor; a second cam configured to move in a third direction substantially orthogonal to the first direction and the second direction, in conjunction when the first cam rotates; a third cam configured to rotate while moving in the third direction when the second cam moves in the third direction; and wherein the lens structure configured to rotate while moving in the third direction when the third cam moves in the third direction and rotates.

According to certain embodiments, the first cam has a cylindrical shape including a first area and a second area continuous with each other, and an area between the first area and the second area has a first slope, wherein the second cam has a cylindrical shape including a third area and a fourth area continuous with each other, and an area between the third area and the fourth area has a second slope the same as the first slope, and wherein the second cam is disposed on an upper area of the first cam in the third direction such that the third area makes contact with the first area, the fourth area makes contact with the second area, and the second cam is engaged with the first cam.

According to certain embodiments, the camera module further includes a shaft passing through the first cam and the second cam, the shaft having one end fixed to a first structure formed in the housing, and wherein the shaft includes a first groove extending in the third direction and a screw-shaped second groove continuous with the first groove.

According to certain embodiments, the third cam is mounted on the shaft and disposed on an upper area of the second cam in the third direction and includes a protrusion protruding from an inner surface of the third cam and inserted into the first groove of the shaft, and wherein when the third cam moves in the third direction the protrusion causes the third cam to rotate.

According to certain embodiments, the lens structure is fixed to an upper portion of the third cam in the third direction, and the lens structure protrudes outside the housing by a first amount while the third cam moves in the third direction and additionally protrudes outside the housing by a second amount smaller than the first amount while performing the rotating as a result of the third cam.

According to certain embodiments, the camera module further includes a flexible printed circuit board frame disposed on an upper portion of the third cam in the third direction to overlap at least part of the lens structure and configured to shield at least part of the flexible printed circuit board, and wherein the flexible printed circuit board frame includes an annular area configured to receive or shield at least part of the rollable portion and a planar area configured to receive or shield at least part of the movable portion and at least part of the connecting portion. According to certain embodiments, an electronic device comprises a housing including a first plate facing a first direction, a second plate facing a second direction opposite to the first direction, and a side member configured to surround a space between the first plate and the second plate; a camera module, at least part of which is disposed in the space; a printed circuit board disposed in the space; and a flexible printed circuit board connecting the camera module and the printed circuit board, wherein between a first position in which the at least part of the camera module is located in the space and a second position in which the at least part of the camera module is located outside the housing in a third direction substantially orthogonal to the first direction and the second direction, the camera module moves in the third direction and rotates to face the first direction or the second direction, wherein the camera module includes a flexible printed circuit board frame configured to receive or shield at least part of the flexible printed circuit board, wherein the flexible printed circuit board includes: a rollable portion including a first distal end of the flexible printed circuit board and a rollable area, wherein the first distal end is connected to one area of the camera module, and at least part of the rollable area is wrapped or unwrapped in the same direction as the rotation of the camera module; a movable portion including a curved area and a second distal end of the flexible printed circuit board, wherein the second distal end extends from the curved area and is connected to the printed circuit board, and a position of the curved area is changed to correspond to the motion of the camera module in the third direction; and a connecting portion configured to connect the rollable portion and the movable portion, and wherein the flexible printed circuit board frame includes: a cylindrical area configured to receive or shield at least part of the rollable portion; and a planar area configured to receive or shield at least part of the movable portion and at least part of the connecting portion, wherein the at least part of the connecting portion is fixed to the planar area. An electronic device (e.g., the electronic device 1000 of FIG. 1 or 10) according to certain embodiments may include a housing (e.g., the housing 100 of FIG. 1) that includes a first plate (e.g., the first plate 110 of FIG. 1) that faces a first direction, a second plate (e.g., the second plate 120 of FIG. 1) that faces a second direction opposite to the first direction, and a side member (e.g., the side member 130 of FIG. 1) that surrounds a space between the first plate and the second plate, a camera module (e.g., the camera module 600 of FIG. 1 or the camera module 700 of FIG. 10), at least part of which is disposed in the space, a printed circuit board (e.g., the printed circuit board 300 of FIG. 1) that is disposed in the space, and a flexible printed circuit board (e.g., the flexible printed circuit board 675 of FIG. 7 or the flexible printed circuit board 765 of FIG. 23) that connects the camera module and the printed circuit board. Between a first position in which the at least part of the camera module is located in the space and a second position in which the at least part of the camera module is located outside the housing in a third direction perpendicular to the first direction and the second direction through the side member, the camera module may perform at least one of linear motion facing the third direction and rotary motion facing the first direction or the second direction. The flexible printed circuit board may include a rollable portion (e.g., the rollable portion 10 of FIG. 7 or the rollable portion 40 of FIG. 23) that includes a first distal end of the flexible printed circuit board and a rollable area, the first distal end being connected to one area of the camera module, and at least part of the rollable area being rolled or unrolled in the same direction as a rotational direction of the camera module to correspond to the rotary motion of the camera module, a movable portion (e.g., the movable portion 30 of FIG. 7 or the movable portion 60 of FIG. 23) that includes a curved area and a second distal end of the flexible printed circuit board, in which the second distal end extends from the curved area and is connected to the printed circuit board, and a position of the curved area is changed to correspond to the linear motion of the camera module, and a connecting portion (e.g., the connecting portion 20 of FIG. 7 or the connecting portion 50 of FIG. 23) that connects the rollable portion and the movable portion.

According to certain embodiments, the camera module may include at least one lens. In the first position, the at least one lens may face the second direction, and in the second position, the at least one lens may face the first direction or the second direction.

According to certain embodiments, the camera module may include a flexible printed circuit board frame (e.g., the flexible printed circuit board frame 670 of FIG. 5 or the flexible printed circuit board frame 760 of FIG. 20) that receives or shields at least part of the flexible printed circuit board.

According to certain embodiments, the flexible printed circuit board frame may include a cylindrical area that receives or shields at least part of the rollable portion and a planar area that receives or shields at least part of the movable portion and at least part of the connecting portion.

According to certain embodiments, the at least part of the connecting portion may be fixed to the planar area of the flexible printed circuit board frame.

According to certain embodiments, when the camera module is located in the first position, the rollable area of the rollable portion may be rolled, and the curved area of the movable portion may be located at a first distance from the connecting portion.

According to certain embodiments, when the camera module is located in the second position, the rollable area of the rollable portion may be unrolled, and the curved area of the movable portion may be located at a second distance from the connecting portion, the second distance being shorter than the first distance.

According to certain embodiments, the second plate may include a first opening (e.g., the first opening 121 of FIG. 1) through which the at least one lens of the camera module in the first position is exposed outside the housing.

According to certain embodiments, the side member may include a second opening through which the at least part of the camera module in the second position protrudes outside the housing.

According to certain embodiments, the camera module may include a first shaft (e.g., the first shaft 620 of FIG. 5) that rotates by being connected with a motor (e.g., the motor 610 of FIG. 5), the first shaft including a first thread on at least part of an outer surface thereof, a first bracket (e.g., the first bracket 640 of FIG. 5) that performs first linear motion in the third direction in conjunction with rotation of the first shaft, a cylindrical cam (e.g., the cylindrical cam 660 of FIG. 5) that performs first rotary motion while performing second linear motion in the third direction in conjunction with the first linear motion of the first bracket in the third direction, and a lens structure (e.g., the lens structure 680 of FIG. 5) that performs second rotary motion while performing third linear motion in the third direction in conjunction with the first linear motion of the first bracket in the third direction and the first rotary motion of the cylindrical cam.

According to certain embodiments, the first bracket may include a first through-hole including a second thread on an inner surface thereof.

According to certain embodiments, the first shaft may be connected with the motor while passing through the first through-hole such that the first thread and the second thread are engaged with each other.

According to certain embodiments, the housing may further include a support member (e.g., the first support member 140 of FIG. 1) that is connected to the side member.

According to certain embodiments, the first bracket may further include a second through-hole.

According to certain embodiments, the camera module may further include a second shaft (e.g., the second shaft 630 of FIG. 5) that passes through the second through-hole and that is fixed to a second bracket (e.g., the second bracket 650 of FIG. 5) and the side member to suppress rotary motion of the first bracket when the first bracket performs the first linear motion in the third direction, the second bracket being formed on the support member.

According to certain embodiments, the first bracket may further include a third through-hole.

According to certain embodiments, the camera module may further include a third shaft (e.g., the third shaft 665 of FIG. 5) that passes through the third through-hole and connects the cylindrical cam and the lens structure.

According to certain embodiments, the third shaft may include a plurality of protruding rings (e.g., the plurality of protruding rings 666 of FIG. 5) that constrain the first bracket, through which the third shaft passes, in the third direction.

According to certain embodiments, the cylindrical cam may include, on at least part of an outer surface thereof, a screw-shaped groove that receives at least part of a protrusion formed on the support member.

According to certain embodiments, at least one of the plurality of protruding rings may be pressed by the first bracket, which performs the first linear motion in the third direction, such that the third shaft performs fourth linear motion in the third direction.

According to certain embodiments, the cylindrical cam may perform the first rotary motion by at least part of the protrusion guided along the screw-shaped groove, while performing the second linear motion in the third direction to correspond to the fourth linear motion of the third shaft in the third direction.

According to certain embodiments, the third shaft may perform third rotary motion to correspond to the first rotary motion of the cylindrical cam.

According to certain embodiments, the lens structure may perform the second rotary motion by the third rotary motion of the third shaft while performing the third linear motion in the third direction by the fourth linear motion of the third shaft in the third direction.

According to certain embodiments, the camera module may include a first cam (e.g., the first cam 722 of FIG. 13) that is connected with a motor (e.g., the motor 711 of FIG. 13) and that performs first rotary motion, a second cam (e.g., the second cam 730 of FIG. 15) that performs first linear motion in the third direction in conjunction with the first rotary motion of the first cam, a third cam (e.g., the third cam 740 of FIG. 18) that performs first rotary motion while performing second linear motion in the third direction in conjunction with the first linear motion of the second cam in the third direction, and a lens structure (e.g., the lens structure 750 of FIG. 19) that performs second rotary motion while performing third linear motion in the third direction in conjunction with the second linear motion of the third cam in the third direction and the first rotary motion of the third cam.

According to certain embodiments, the first cam may have a cylindrical shape including a first area and a second area continuous with each other, and an area between the first area and the second area may have a first slope.

According to certain embodiments, the second cam may have a cylindrical shape including a third area and a fourth area continuous with each other, and an area between the third area and the fourth area may have a second slope the same as the first slope.

According to certain embodiments, the second cam may be disposed on an upper area of the first cam in the third direction such that the third area makes contact with the first area, the fourth area makes contact with the second area, and the second cam is engaged with the first cam.

According to certain embodiments, the camera module may further include a shaft (e.g., the shaft 723 of FIG. 13) that passes through the first cam and the second cam without being connected with the first cam and the second cam, the shaft having one end fixed to a first structure formed in the housing.

According to certain embodiments, the shaft may include a first groove extending in the third direction and a screw-shaped second groove continuous with the first groove.

According to certain embodiments, the third cam may be mounted on the shaft and may be disposed on an upper area of the second cam in the third direction.

According to certain embodiments, the third cam may include a protrusion that protrudes from an inner surface of the third cam and that is inserted into the first groove of the shaft.

According to certain embodiments, the third cam may perform the second linear motion in the third direction by the protrusion guided along the first groove of the shaft and may perform the first rotary motion by the protrusion guided along the second groove of the shaft.

According to certain embodiments, the lens structure may be fixed to an upper portion of the third cam in the third direction.

According to certain embodiments, the lens structure may protrude outside the housing by a first stroke while performing the third linear motion by the second linear motion of the third cam in the third direction and may additionally protrude outside the housing by a second stroke smaller than the first stroke while performing the second rotary motion by the first rotary motion of the third cam.

According to certain embodiments, the camera module may further include a flexible printed circuit board frame that is disposed on an upper portion of the third cam in the third direction to overlap at least part of the lens structure and that shields at least part of the flexible printed circuit board.

According to certain embodiments, the flexible printed circuit board frame may include an annular area that receives or shields at least part of the rollable portion and a planar area that receives or shields at least part of the movable portion and at least part of the connecting portion.

An electronic device (e.g., the electronic device 1000 of FIG. 1 or 10) according to certain embodiments may include a housing (e.g., the housing 100 of FIG. 1) that includes a first plate (e.g., the first plate 110 of FIG. 1) that faces a first direction, a second plate (e.g., the second plate 120 of FIG. 1) that faces a second direction opposite to the first direction, and a side member (e.g., the side member 130 of FIG. 1) that surrounds a space between the first plate and the second plate, a camera module (e.g., the camera module 600 of FIG. 1 or the camera module 700 of FIG. 10), at least part of which is disposed in the space, a printed circuit board (e.g., the printed circuit board 300 of FIG. 1) that is disposed in the space, and a flexible printed circuit board (e.g., the flexible printed circuit board 675 of FIG. 7 or the flexible printed circuit board 765 of FIG. 23) that connects the camera module and the printed circuit board. Between a first position in which the at least part of the camera module is located in the space and a second position in which the at least part of the camera module is located outside the housing in a third direction perpendicular to the first direction and the second direction, the camera module may perform at least one of linear motion facing the third direction and rotary motion facing the first direction or the second direction. The camera module may include a flexible printed circuit board frame (e.g., the flexible printed circuit board frame 670 of FIG. 5 or the flexible printed circuit board frame 760 of FIG. 20) that receives or shields at least part of the flexible printed circuit board. The flexible printed circuit board may include a rollable portion (e.g., the rollable portion 10 of FIG. 7 or the rollable portion 40 of FIG. 23) that includes a first distal end of the flexible printed circuit board and a rollable area, the first distal end being connected to one area of the camera module, and at least part of the rollable area being rolled or unrolled in the same direction as a rotational direction of the camera module to correspond to the rotary motion of the camera module, a movable portion (e.g., the movable portion 30 of FIG. 7 or the movable portion 60 of FIG. 23) that includes a curved area and a second distal end of the flexible printed circuit board, in which the second distal end extends from the curved area and is connected to the printed circuit board, and a position of the curved area is changed to correspond to the linear motion of the camera module, and a connecting portion (e.g., the connecting portion 20 of FIG. 7 or the connecting portion 50 of FIG. 23) that connects the rollable portion and the movable portion. The flexible printed circuit board frame may include a cylindrical area that receives or shields at least part of the rollable portion and a planar area that receives or shields at least part of the movable portion and at least part of the connecting portion, in which the at least part of the connecting portion is fixed to the planar area.

Figure 27:
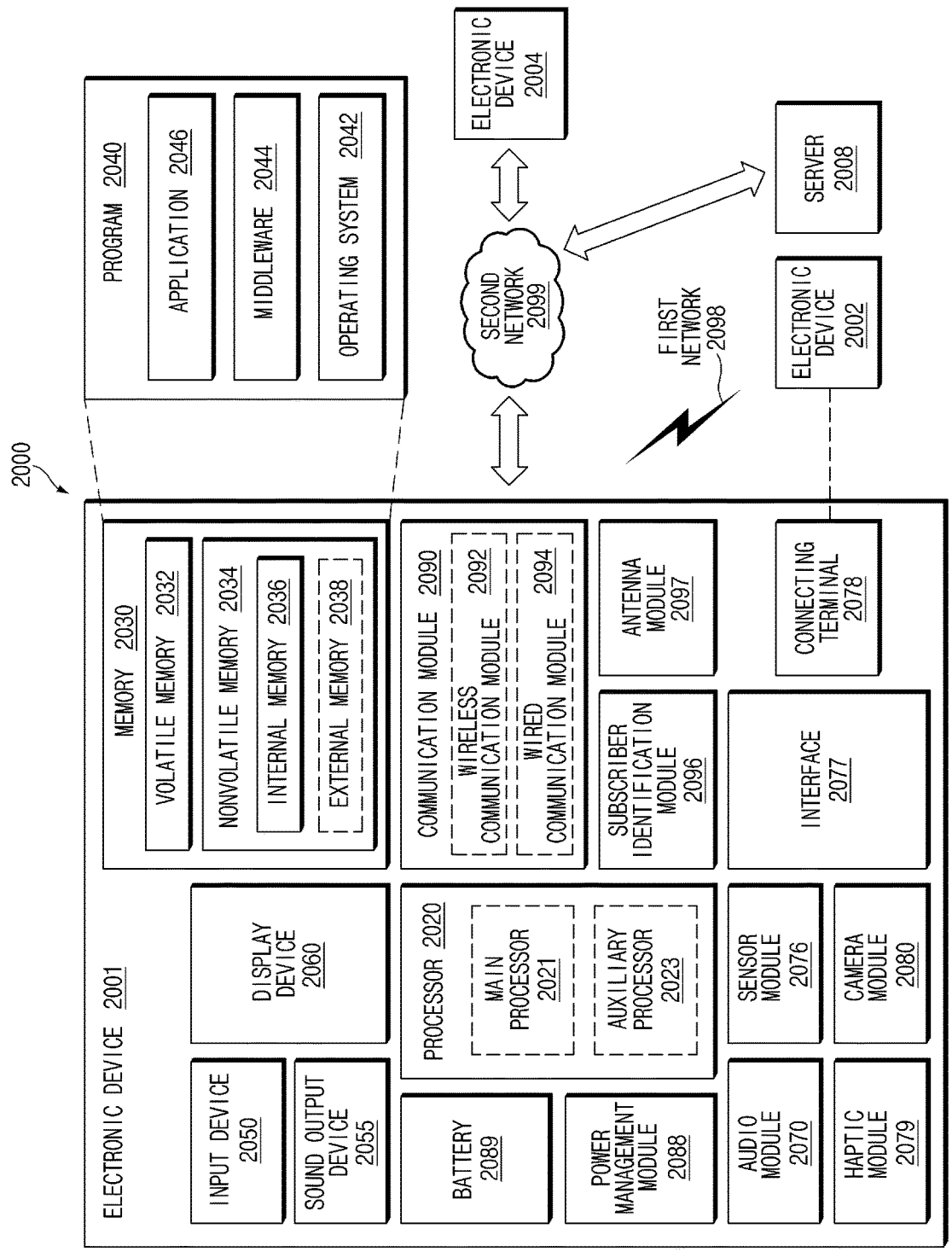
FIG. 27 is a block diagram illustrating an electronic device in a network environment according to certain embodiments.

FIG. 27 is a block diagram illustrating an electronic device in a network environment according to certain embodiments.

Referring to FIG. 27, the electronic device 2001 in the network environment 2000 may communicate with an electronic device 2002 via a first network 2098 (e.g., a short-range wireless communication network), or an electronic device 2004 or a server 2008 via a second network 2099 (e.g., a long-range wireless communication network). According to an embodiment, the electronic device 2001 may communicate with the electronic device 2004 via the server 2008. According to an embodiment, the electronic device 2001 may include a processor 2020, memory 2030, an input device 2050, a sound output device 2055, a display device 2060, an audio module 2070, a sensor module 2076, an interface 2077, a haptic module 2079, a camera module 2080, a power management module 2088, a battery 2089, a communication module 2090, a subscriber identification module (SIM) 2096, or an antenna module 2097. In some embodiments, at least one (e.g., the display device 2060 or the camera module 2080) of the components may be omitted from the electronic device 2001, or one or more other components may be added in the electronic device 2001. In some embodiments, some of the components may be implemented as single integrated circuitry. For example, the sensor module 2076 (e.g., a fingerprint sensor, an iris sensor, or an illuminance sensor) may be implemented as embedded in the display device 2060 (e.g., a display).

The processor 2020 may execute, for example, software (e.g., a program 2040) to control at least one other component (e.g., a hardware or software component) of the electronic device 2001 coupled with the processor 2020, and may perform various data processing or computation. According to one embodiment, as at least part of the data processing or computation, the processor 2020 may load a command or data received from another component (e.g., the sensor module 2076 or the communication module 2090) in volatile memory 2032, process the command or the data stored in the volatile memory 2032, and store resulting data in non-volatile memory 2034. According to an embodiment, the processor 2020 may include a main processor 2021 (e.g., a central processing unit (CPU) or an application processor (AP)), and an auxiliary processor 2023 (e.g., a graphics processing unit (GPU), an image signal processor (ISP), a sensor hub processor, or a communication processor (CP)) that is operable independently from, or in conjunction with, the main processor 2021. Additionally or alternatively, the auxiliary processor 2023 may be adapted to consume less power than the main processor 2021, or to be specific to a specified function. The auxiliary processor 2023 may be implemented as separate from, or as part of the main processor 2021.

The auxiliary processor 2023 may control at least some of functions or states related to at least one component (e.g., the display device 2060, the sensor module 2076, or the communication module 2090) among the components of the electronic device 2001, instead of the main processor 2021 while the main processor 2021 is in an inactive (e.g., sleep) state, or together with the main processor 2021 while the main processor 2021 is in an active state (e.g., executing an application). According to an embodiment, the auxiliary processor 2023 (e.g., an image signal processor or a communication processor) may be implemented as part of another component (e.g., the camera module 2080 or the communication module 2090) functionally related to the auxiliary processor 2023.

The memory 2030 may store various data used by at least one component (e.g., the processor 2020 or the sensor module 2076) of the electronic device 2001. The various data may include, for example, software (e.g., the program 2040) and input data or output data for a command related thereto. The memory 2030 may include the volatile memory 2032 or the non-volatile memory 2034.

The program 2040 may be stored in the memory 2030 as software, and may include, for example, an operating system (OS) 2042, middleware 2044, or an application 2046.

The input device 2050 may receive a command or data to be used by other component (e.g., the processor 2020) of the electronic device 2001, from the outside (e.g., a user) of the electronic device 2001. The input device 2050 may include, for example, a microphone, a mouse, a keyboard, or a digital pen (e.g., a stylus pen).

The sound output device 2055 may output sound signals to the outside of the electronic device 2001. The sound output device 2055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 2060 may visually provide information to the outside (e.g., a user) of the electronic device 2001. The display device 2060 may include, for example, a display, a hologram device, or a projector and control circuitry to control a corresponding one of the display, hologram device, and projector. According to an embodiment, the display device 2060 may include touch circuitry adapted to detect a touch, or sensor circuitry (e.g., a pressure sensor) adapted to measure the intensity of force incurred by the touch.

The audio module 2070 may convert a sound into an electrical signal and vice versa. According to an embodiment, the audio module 2070 may obtain the sound via the input device 2050, or output the sound via the sound output device 2055 or a headphone of an external electronic device (e.g., an electronic device 2002) directly (e.g., wiredly) or wirelessly coupled with the electronic device 2001.

The sensor module 2076 may detect an operational state (e.g., power or temperature) of the electronic device 2001 or an environmental state (e.g., a state of a user) external to the electronic device 2001, and then generate an electrical signal or data value corresponding to the detected state. According to an embodiment, the sensor module 2076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2077 may support one or more specified protocols to be used for the electronic device 2001 to be coupled with the external electronic device (e.g., the electronic device 2002) directly (e.g., wiredly) or wirelessly. According to an embodiment, the interface 2077 may include, for example, a high definition multimedia interface (HDMI), a universal serial bus (USB) interface, a secure digital (SD) card interface, or an audio interface.

A connecting terminal 2078 may include a connector via which the electronic device 2001 may be physically connected with the external electronic device (e.g., the electronic device 2002). According to an embodiment, the connecting terminal 2078 may include, for example, a HDMI connector, a USB connector, a SD card connector, or an audio connector (e.g., a headphone connector).

The haptic module 2079 may convert an electrical signal into a mechanical stimulus (e.g., a vibration or a movement) or electrical stimulus which may be recognized by a user via his tactile sensation or kinesthetic sensation. According to an embodiment, the haptic module 2079 may include, for example, a motor, a piezoelectric element, or an electric stimulator.

The camera module 2080 may capture a still image or moving images. According to an embodiment, the camera module 2080 may include one or more lenses, image sensors, image signal processors, or flashes.

The power management module 2088 may manage power supplied to the electronic device 2001. According to one embodiment, the power management module 2088 may be implemented as at least part of, for example, a power management integrated circuit (PMIC).

The battery 2089 may supply power to at least one component of the electronic device 2001. According to an embodiment, the battery 2089 may include, for example, a primary cell which is not rechargeable, a secondary cell which is rechargeable, or a fuel cell.

The communication module 2090 may support establishing a direct (e.g., wired) communication channel or a wireless communication channel between the electronic device 2001 and the external electronic device (e.g., the electronic device 2002, the electronic device 2004, or the server 2008) and performing communication via the established communication channel. The communication module 2090 may include one or more communication processors that are operable independently from the processor 2020 (e.g., the application processor (AP)) and supports a direct (e.g., wired) communication or a wireless communication. According to an embodiment, the communication module 2090 may include a wireless communication module 2092 (e.g., a cellular communication module, a short-range wireless communication module, or a global navigation satellite system (GNSS) communication module) or a wired communication module 2094 (e.g., a local area network (LAN) communication module or a power line communication (PLC) module). A corresponding one of these communication modules may communicate with the external electronic device via the first network 2098 (e.g., a short-range communication network, such as Bluetooth™, wireless-fidelity (Wi-Fi) direct, or infrared data association (IrDA)) or the second network 2099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2092 may identify and authenticate the electronic device 2001 in a communication network, such as the first network 2098 or the second network 2099, using subscriber information (e.g., international mobile subscriber identity (IMSI)) stored in the subscriber identification module 2096.

The antenna module 2097 may transmit or receive a signal or power to or from the outside (e.g., the external electronic device) of the electronic device 2001. According to an embodiment, the antenna module 2097 may include an antenna including a radiating element composed of a conductive material or a conductive pattern formed in or on a substrate (e.g., PCB). According to an embodiment, the antenna module 2097 may include a plurality of antennas. In such a case, at least one antenna appropriate for a communication scheme used in the communication network, such as the first network 2098 or the second network 2099, may be selected, for example, by the communication module 2090 (e.g., the wireless communication module 2092) from the plurality of antennas. The signal or the power may then be transmitted or received between the communication module 2090 and the external electronic device via the selected at least one antenna. According to an embodiment, another component (e.g., a radio frequency integrated circuit (RFIC)) other than the radiating element may be additionally formed as part of the antenna module 2097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2001 and the external electronic device 2004 via the server 2008 coupled with the second network 2099. Each of the electronic devices 2002 and 2004 may be a device of a same type as, or a different type, from the electronic device 2001. According to an embodiment, all or some of operations to be executed at the electronic device 2001 may be executed at one or more of the external electronic devices 2002, 2004, or 2008. For example, if the electronic device 2001 should perform a function or a service automatically, or in response to a request from a user or another device, the electronic device 2001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2001. The electronic device 2001 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 2040) including one or more instructions that are stored in a storage medium (e.g., internal memory 2036 or external memory 2038) that is readable by a machine (e.g., the electronic device 2001). For example, a processor (e.g., the processor 2020) of the machine (e.g., the electronic device 2001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

According to the certain embodiments, by excluding a hole for exposure of a camera from the front surface of the electronic device, design aesthetics of the electronic device may be improved, and a large area display may be implemented.

According to the certain embodiments, the electronic device may take images of subjects ahead of and behind the electronic device based on one camera module. Accordingly, the interior space of the electronic device may be efficiently designed, and manufacturing cost may be reduced.

In addition, the disclosure may provide various effects that are directly or indirectly recognized.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing including a first plate facing a first direction, a second plate facing a second direction opposite to the first direction, and a side member surrounding a space between the first plate and the second plate;
a camera module having a lens structure comprising one or more lenses, configured to move from a first position to a second position and vice versa,
wherein in the first position, the lens structure is disposed inside the space, and an optical axis of the one or more lenses is substantially parallel to the second direction,
wherein in the second position, the lens structure protrudes from the side member, and the optical axis of the one or more lenses is substantially parallel to the first direction;
a printed circuit board disposed in the space; and
a flexible printed circuit board connecting the camera module and the printed circuit board,
wherein the flexible printed circuit board includes:
a rollable portion including a first distal end of the flexible printed circuit board connected to one area of the camera module and a rollable area, wherein the rollable area wraps around the one area of the camera module when the camera module moves from the second position to the first position and unwraps when the camera module moves from the first position to the second position;
a movable portion including a curved area and a second distal end of the flexible printed circuit board, wherein the second distal end extends from the curved area and is connected to the printed circuit board; and
a connecting portion connecting the rollable area and the movable portion,
wherein the camera module includes a flexible printed circuit board frame configured to receive or shield at least part of the flexible printed circuit board, and
wherein the flexible printed circuit board frame includes a cylindrical area configured to receive or shield at least part of the rollable portion and a planar area configured to receive or shield at least part of the movable portion and at least part of the connecting portion.

2. The electronic device of claim 1, wherein the at least part of the connecting portion is fixed to the planar area of the flexible printed circuit board frame.

3. The electronic device of claim 1, wherein when the camera module is located in the first position, the curved area is located at a first distance from the connecting portion, and
wherein when the camera module is located in the second position, the curved area is located at a second distance from the connecting portion, the second distance being shorter than the first distance.

4. The electronic device of claim 1, wherein the second plate includes a first opening, and when the camera module is in the first position the first opening exposes at least one lens of the one or more lenses of the lens structure, and
wherein the side member includes a second opening through which the lens structure protrudes when the camera module is in the second position.

5. The electronic device of claim 1, wherein the camera module further includes:
a first shaft rotatably connected with a motor, the first shaft including a first thread on at least part of an outer surface thereof;
a first bracket configured to move in a third direction substantially orthogonal to the first direction and the second direction along the first shaft, when the first shaft rotates;
a cylindrical cam configured to rotate while moving in the third direction, when the first bracket moves in the third direction; and
wherein the lens structure is connected to the cylindrical cam.

6. The electronic device of claim 5, wherein the first bracket includes a first through-hole including a second thread on an inner surface thereof, the second thread of the first bracket mating with the first thread of the first shaft.

7. The electronic device of claim 5, wherein the housing further includes a support member connected to the side member,
wherein the first bracket includes a second through-hole, and
wherein the camera module further includes a second shaft configured to pass through the second through-hole and fixed to a second bracket and the side member.

8. The electronic device of claim 7, wherein the first bracket further includes a third through-hole, and
wherein the camera module further includes a third shaft configured to pass through the third through-hole and connect the cylindrical cam and the lens structure.

9. The electronic device of claim 8, wherein the third shaft includes a plurality of protruding rings configured to constrain the first bracket, through which the third shaft passes, in the third direction, and
wherein the cylindrical cam includes, on at least part of an outer surface thereof, a screw-shaped groove receiving at least part of a protrusion formed on the support member.

10. The electronic device of claim 9, wherein at least one of the plurality of protruding rings is pressed by the first bracket and configured to move in the third direction, causing the third shaft to move in the third direction, and
wherein the protrusion causes the cylindrical cam rotate, while moving in the third direction.

11. The electronic device of claim 10, wherein the third shaft rotates to correspond to rotation of the cylindrical cam, and
wherein the third shaft causes the lens structure to rotate while moving in the third direction.

12. The electronic device of claim 1, wherein the camera module further includes:
a first cam rotatably connected with a motor;
a second cam configured to move in a third direction substantially orthogonal to the first direction and the second direction, in conjunction when the first cam rotates;
a third cam configured to rotate while moving in the third direction when the second cam moves in the third direction; and
wherein the lens structure configured to rotate while moving in the third direction when the third cam moves in the third direction and rotates.

13. The electronic device of claim 12, wherein the first cam has a cylindrical shape including a first area and a second area continuous with each other, and an area between the first area and the second area has a first slope,
wherein the second cam has a cylindrical shape including a third area and a fourth area continuous with each other, and an area between the third area and the fourth area has a second slope the same as the first slope, and
wherein the second cam is disposed on an upper area of the first cam in the third direction such that the third area makes contact with the first area, the fourth area makes contact with the second area, and the second cam is engaged with the first cam.

14. The electronic device of claim 13, wherein the camera module further includes a shaft passing through the first cam and the second cam, the shaft having one end fixed to a first structure formed in the housing, and
wherein the shaft includes a first groove extending in the third direction and a screw-shaped second groove continuous with the first groove.

15. The electronic device of claim 14, wherein the third cam is mounted on the shaft and disposed on an upper area of the second cam in the third direction and includes a protrusion protruding from an inner surface of the third cam and inserted into the first groove of the shaft, and
wherein when the third cam moves in the third direction the protrusion causes the third cam to rotate.

16. The electronic device of claim 15, wherein the lens structure is fixed to an upper portion of the third cam in the third direction, and
wherein the lens structure protrudes outside the housing by a first amount while the third cam moves in the third direction and additionally protrudes outside the housing by a second amount smaller than the first amount while performing the rotating as a result of the third cam.

17. The electronic device of claim 16, wherein the flexible printed circuit board frame is disposed on the upper portion of the third cam in the third direction to overlap at least part of the lens structure.

18. An electronic device comprising:
a housing including a first plate facing a first direction, a second plate facing a second direction opposite to the first direction, and a side member configured to surround a space between the first plate and the second plate;
a camera module, at least part of which is disposed in the space;
a printed circuit board disposed in the space; and
a flexible printed circuit board connecting the camera module and the printed circuit board,
wherein between a first position in which the at least part of the camera module is located in the space and a second position in which the at least part of the camera module is located outside the housing in a third direction substantially orthogonal to the first direction and the second direction, the camera module moves in the third direction and rotates to face the first direction or the second direction,
wherein the camera module includes a flexible printed circuit board frame configured to receive or shield at least part of the flexible printed circuit board, wherein the flexible printed circuit board includes:
a rollable portion including a first distal end of the flexible printed circuit board and a rollable area, wherein the first distal end is connected to one area of the camera module, and at least part of the rollable area is wrapped or unwrapped in the same direction as the rotation of the camera module;
a movable portion including a curved area and a second distal end of the flexible printed circuit board, wherein the second distal end extends from the curved area and is connected to the printed circuit board, and a position of the curved area is changed to correspond to motion of the camera module in the third direction; and
a connecting portion configured to connect the rollable portion and the movable portion, and wherein the flexible printed circuit board frame includes:
a cylindrical area configured to receive or shield at least part of the rollable portion; and
a planar area configured to receive or shield at least part of the movable portion and at least part of the connecting portion, wherein the at least part of the connecting portion is fixed to the planar area.

* * * * *